(12) United States Patent
Fu et al.

(10) Patent No.: US 11,450,602 B2
(45) Date of Patent: Sep. 20, 2022

(54) HYBRID METHOD FOR FORMING SEMICONDUCTOR INTERCONNECT STRUCTURE

(71) Applicant: Taiwan Semiconductor Manufacturing Co., Ltd., Hsin-Chu (TW)

(72) Inventors: Shih-Kang Fu, Taoyuan County (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 5 days.

(21) Appl. No.: 16/837,762

(22) Filed: Apr. 1, 2020

(65) Prior Publication Data
US 2021/0313262 A1  Oct. 7, 2021

(51) Int. Cl.
| | |
|---|---|
| H01L 23/522 | (2006.01) |
| H01L 23/528 | (2006.01) |
| H01L 23/532 | (2006.01) |
| H01L 27/088 | (2006.01) |
| H01L 21/8234 | (2006.01) |
| H01L 21/768 | (2006.01) |

(52) U.S. Cl.
CPC .... *H01L 23/5226* (2013.01); *H01L 21/76807* (2013.01); *H01L 21/76816* (2013.01); *H01L 21/76831* (2013.01); *H01L 21/76832* (2013.01); *H01L 21/76877* (2013.01); *H01L 21/823431* (2013.01); *H01L 21/823475* (2013.01); *H01L 23/5283* (2013.01); *H01L 23/53252* (2013.01); *H01L 27/0886* (2013.01)

(58) Field of Classification Search
CPC ............. H01L 29/66545; H01L 29/785; H01L 29/66795; H01L 23/528; H01L 23/485; H01L 23/5226
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2* | 8/2015 | Wang ................ | H01L 29/66795 |
| 9,236,267 B2 | 1/2016 | De et al. | |
| 9,236,300 B2 | 1/2016 | Liaw | |
| 9,520,482 B1 | 12/2016 | Chang et al. | |

(Continued)

*Primary Examiner* — Jaehwan Oh
*Assistant Examiner* — John M Parker
(74) *Attorney, Agent, or Firm* — Haynes and Boone, LLP

(57) ABSTRACT

The present disclosure provides a method for forming semiconductor structures. The method includes providing a device having a substrate, a first dielectric layer over the substrate, and a first conductive feature over the first dielectric layer, the first conductive feature comprising a first metal, the first metal being a noble metal. The method also includes depositing a second dielectric layer over the first dielectric layer and covering at least sidewalls of the first conductive feature; etching the second dielectric layer to form a trench; and forming a second conductive feature in the trench. The second conductive feature comprises a second metal different from the first metal.

20 Claims, 20 Drawing Sheets

(56) References Cited

U.S. PATENT DOCUMENTS

| | | | |
|---|---|---|---|
| 9,576,814 B2 | 2/2017 | Wu et al. | |
| 2010/0321095 A1* | 12/2010 | Mikawa | H01L 27/24 327/525 |
| 2011/0220861 A1* | 9/2011 | Himeno | H01L 27/2463 257/4 |
| 2012/0104350 A1* | 5/2012 | Himeno | H01L 45/146 257/4 |
| 2016/0013133 A1* | 1/2016 | Gu | H01L 23/5222 257/758 |
| 2020/0279745 A1* | 9/2020 | Cheng | H01L 29/66568 |

\* cited by examiner

HYBRID METHOD FOR FORMING SEMICONDUCTOR INTERCONNECT STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As a part of the semiconductor fabrication, interconnect structures (e.g., metal lines and vias) may be formed using a damascene (or dual-damascene) process to provide electrical interconnections for various components in an IC. For example, metal lines may be formed by etching trench-like openings in an inter-metal dielectric (IMD) layer and followed by an electro-chemical plating process to fill the trench-like openings with metal (e.g., copper). As semiconductor device sizes continue to shrink, the damascene or dual-damascene process will see a number of potential problems that may affect the quality of the metallization layers. For example, when a metal line critical dimension (CD) is below 20-nanometer (nm), the trench-like openings may become too narrow and thus may not be properly filled with metal through a damascene process, resulting in relatively high resistances. Therefore, while semiconductor interconnect structure formation processes have generally been adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
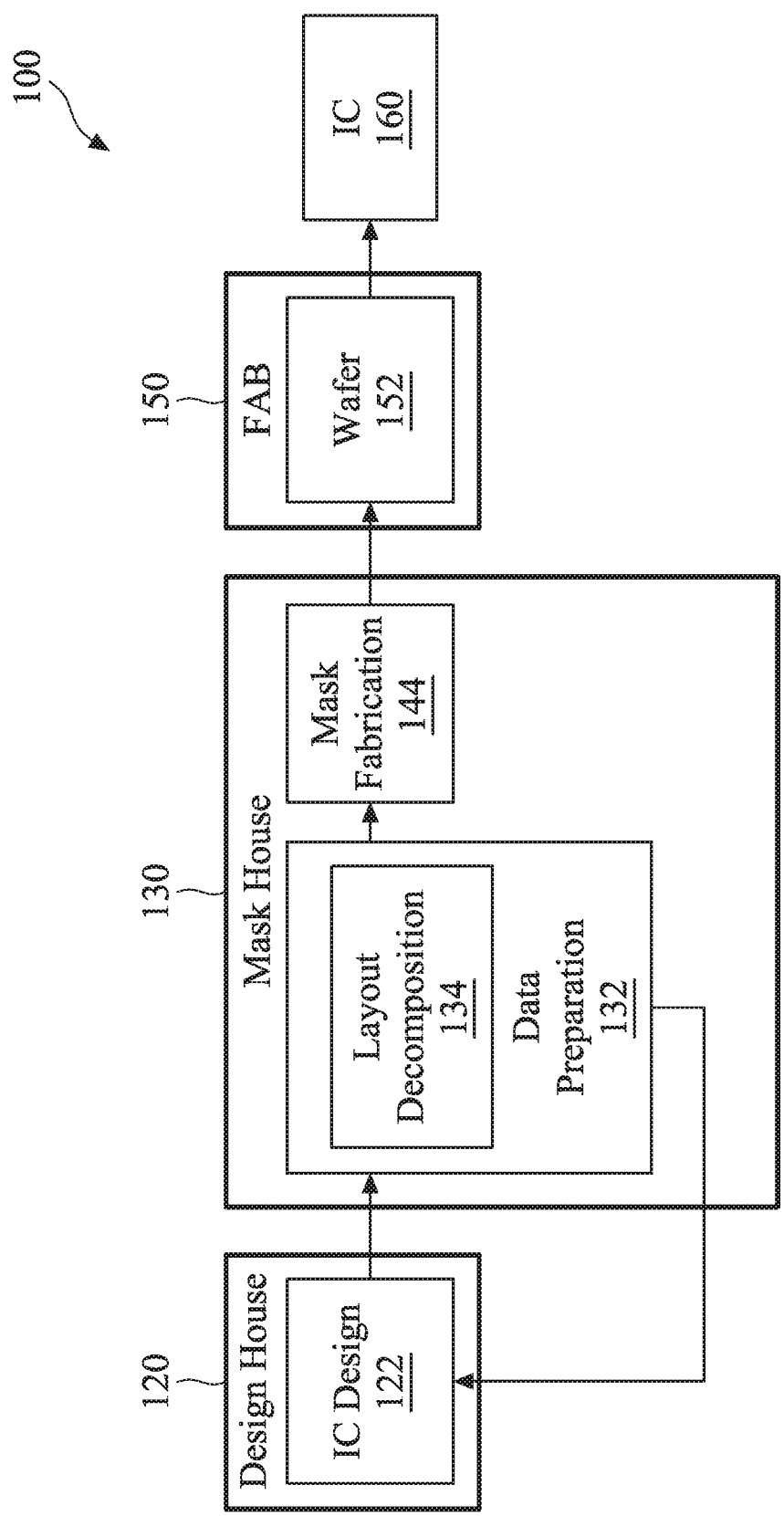
FIG. 1 is a block diagram of an IC manufacturing flow according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

An integrated circuit (IC) contain a plurality of patterned metal lines separated by inter-wiring spacings. Metal patterns of vertically spaced metallization layers are electrically interconnected by vias. Metal lines formed in trench-like openings typically extend substantially parallel to the semiconductor substrate. Semiconductor devices of such type, according to current technology, may comprise eight or more levels of metallization layers to satisfy device geometry and micro-miniaturization requirements.

A common process for forming metal lines or vias is known as "damascene" process. Generally, a damascene process involves forming trench-like openings in an inter-metal dielectric (IMD) layer. A trench-like opening is typically formed using conventional lithographic and etching techniques. After the trench-like opening is formed, a diffusion barrier layer and an adhesion layer are deposited within the trench-like opening. An electro-chemical plating process is then used to fill the trench-like opening with metal or metal alloys to form a metal line and possibly a via underneath the metal line as well. Excess metal material on the surface of the IMD layer is then removed by chemical mechanical planarization (CMP).

With increasing packing density in microelectronic devices, copper (Cu) has been used as an interconnecting metal among other available metal materials due to its superior electrical conductivity (5.96E7 S/m) and excellent resistance against electro migration. The damascene process with copper, which involves copper electroplating followed by CMP of the copper, has been commonly adopted for patterning copper. At the meantime, as semiconductor device sizes continue to shrink, the damascene process with copper also sees a number of potential problems that may affect the quality of the metallization layers. For example, when a metal line critical dimension (CD) is below 20-nanometer (nm), a trench-like opening may become too narrow and the stack of diffusion barrier layer and adhesion layer will occupy substantial portions of the openings, leaving less room for the more conductive copper. The remaining smaller amount of copper has higher resistance and thus degrade semiconductor device performance. This problem is particularly acute in high aspect ratio trench-like openings of small width. Moreover, the trench-like openings may not be properly filled in a damascene process, such that the top portion of the openings may be blocked, which may create a void underneath that deteriorates device performance. Besides, the narrower copper lines may have a shorter lifetime before the higher current density destroys them by electro migration.

This invention is related generally to interconnect structures in integrated circuits, and more particularly to a hybrid method that combines metal etching process and damascene process, which results in an interconnect structure that includes narrow metal lines formed by a noble metal (or other suitable metals) through a metal etching process and relatively wider metal lines formed by copper (or other suitable metals) through damascene process. In embodiments of the present disclosure, the hybrid method allows narrow metal lines to be formed of a bulk metal other than copper, which provides a lower resistance than copper's otherwise problematic filling in narrow trench-like openings, while other metal lines that are relatively wider still benefit from copper's low resistivity.

In a hybrid method for forming interconnect structures, an IC layout defining various metal lines in the same IMD layer is decomposed into two subsets and each of the two subsets appears in a separate photomask layer (or a masking layer) in a data file. The data file is then used to fabricate photomasks. Two photomasks corresponding to the two subsets are then used in two different processes, one defines metal lines narrower than a predetermined width (i.e., narrow metal lines) suitable for metal etching process and another defines metal lines wider than the predetermined width (i.e., wide metal lines) suitable for damascene process, for collectively defining metal lines made of different metals in the same IMD layer. Using two photomasks in two different processes to pattern metal lines in the same IMD layer distinguishes the hybrid method from traditional methods that use merely one process to accomplish the task. As used herein, a photomask (or mask or reticle) is an apparatus used in photolithography (or lithography), such as a plate having fused quartz substrate with a patterned chromium layer for deep ultraviolet (DUV) lithography, while a photomask layer is a data file (such as a GDS file) used for fabricating a photomask.

Decomposing an IC layout may be performed at a design stage by design engineers and/or layout engineers. Alternatively or additionally, it may be performed at a later stage after the design stage, for example, by a foundry in a fabrication stage. FIG. 1 is a simplified block diagram of an embodiment of an IC manufacturing system 100 and an IC manufacturing flow associated therewith. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an IC device 160. The various entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by separate companies or by a single company, and may even coexist in a common facility and use common resources.

The design house (or design team) 120 generates an IC design layout (or IC layout) 122. The IC design layout 122 includes various geometrical patterns (e.g., polygons representing metal lines) designed for the IC device 160. The geometrical patterns correspond to IC features in one or more semiconductor layers that make up the IC device 160. Exemplary IC features include active regions, gate electrodes, source and drain features, isolation features, metal lines, contact plugs, vias, and so on. The design house 120 implements appropriate design procedures to form the IC design layout 122. The design procedures may include logic design, physical design, place and route, and/or various design checking operations. The IC design layout 122 is presented in one or more data files having information of the geometrical patterns. For example, the IC design layout 122 can be expressed in a GDSII file format or DFII file format.

The mask house 130 uses the IC design layout 122 to manufacture a set of masks to be used for fabricating the various layers of the IC device 160 according to the IC design layout 122. The mask house 130 performs data preparation 132 and mask fabrication 144. The data preparation 132 translates the IC design layout 122 into a form that can be physically written by a mask writer. The mask fabrication 144 fabricates the set of masks (photomask or reticle).

In the present embodiment, the data preparation 132 includes a layout decomposition 134 which is configured to decompose a layout representing metal lines in one IMD layer into two subsets based on metal line widths which would be suitable for two different processes (e.g., metal etching process and damascene process) employed by the fab 150. The data preparation 132, particularly the layout decomposition 134, may produce feedback to the design house 120, which may be used to modify (or adjust) the IC design layout 122 to make it compliant for the manufacturing processes in the fab 150. As discussed above, the layout decomposition 134 may be implemented by the design house 120, instead of by the mask house 130, in some embodiments. The data preparation 132 may further include other manufacturing flows such as optical proximity correction (OPC), off-axis illumination, sub-resolution assist features, other suitable techniques, or combinations thereof. The details of the layout decomposition 134 will be discussed in later section of the present disclosure.

After the data preparation 132 prepares data for the mask layers, the mask fabrication 144 fabricates a group of masks including the two masks for the hybrid method for forming interconnect structures. For example, an electron-beam (e-beam) or a mechanism of multiple e-beams is used to form a pattern on a mask based on data files derived from the IC design layout 122. The mask can be formed in various technologies such as binary masks, phase shifting masks, and EUV masks. For example, a binary mask includes a transparent substrate (e.g., fused quartz) and an opaque material (e.g., chromium) coated on the substrate. The opaque material is patterned according to the mask data, thereby forming opaque regions and transparent regions on the binary mask. A radiation beam, such as an ultraviolet (UV) beam, is blocked by the opaque regions and transmits through the transparent regions, thereby transferring an image of the mask to a sensitive material layer (e.g., photoresist) coated on a wafer 152. For another example, a EUV mask includes a low thermal expansion substrate, a reflective multilayer (ML) over the substrate, and an absorption layer over the ML. The absorption layer is patterned according to the mask data. A EUV beam is either absorbed by the patterned absorption layer or reflected by the ML, thereby transferring an image of the mask to a sensitive material layer (e.g., photoresist) coated on the wafer 152. In some embodiments, the fab 150 may also employ some kind of maskless lithography, such as e-beam lithography. For example, one of the masks may be based on an e-beam lithography. In such a case, the data preparation 132 may prepare the direct-write data file for the maskless lithography and the mask fabrication 144 does not make a photomask for those particular subsets to be produced by the maskless lithography.

The IC manufacturer (fab) 150, such as a semiconductor foundry, uses the masks to fabricate the IC device 160 using, for example, lithography processes. The fab 150 may include front-end-of-line (FEOL) fabrication facility and back-end-of-line (BEOL) fabrication facility. Particularly, the fab 150 implements two different patterning processes to define metal lines on the semiconductor wafer 152. For example, metal etching process using one of the masks to pattern narrow metal lines and damascene process using another of the masks to define wide metal lines. The narrow metal lines and wide metal lines collectively form interconnect structures in a certain IMD layer on the wafer 152.

Figure 2:
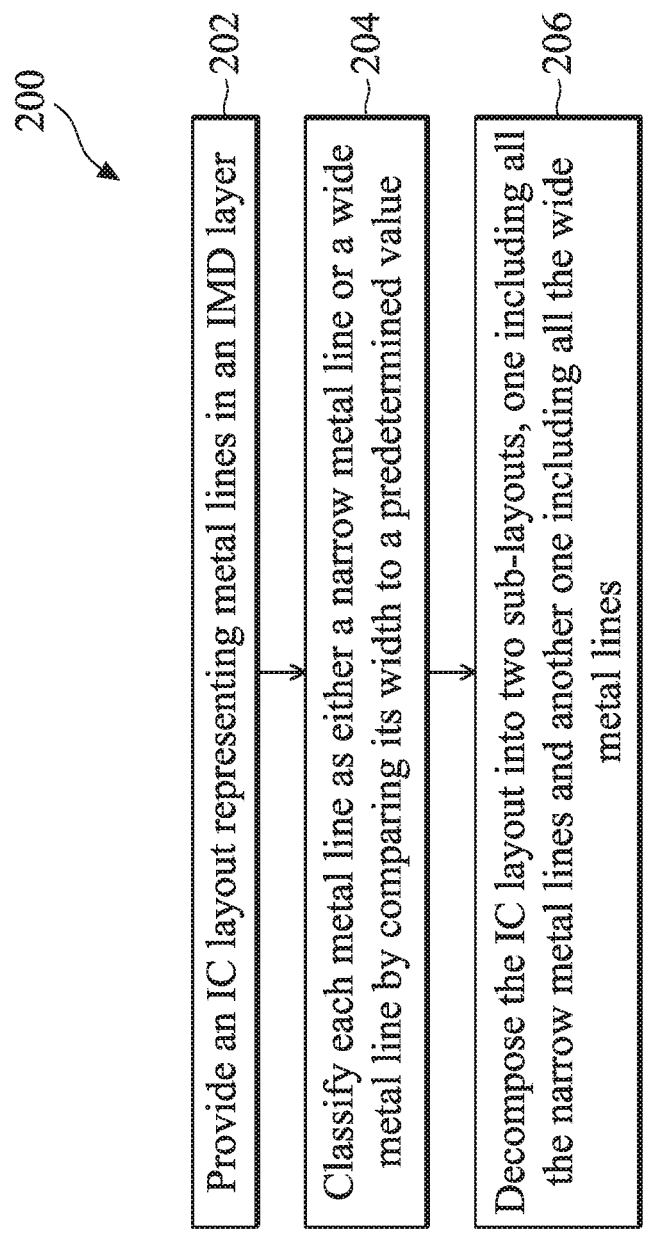
FIG. 2 is a flow chart of a method of decomposing an IC layout into sub-layouts according to various aspects of the present disclosure.

FIG. 2 illustrate a flow chart of a method 200, constructed according to various aspects of the present disclosure. Embodiments of the method 200 may be implemented by the layout decomposition 134 (FIG. 1). The method 200 is an example, and is not intended to limit the present disclosure beyond what is explicitly recited in the claims. Additional operations can be provided before, during, and after the method 200, and some operations described can be replaced, eliminated, or relocated for additional embodiments of the method. The method 200 is described below in conjunction with FIG. 3, which graphically illustrate some principles of the method 200.

Figure 3:
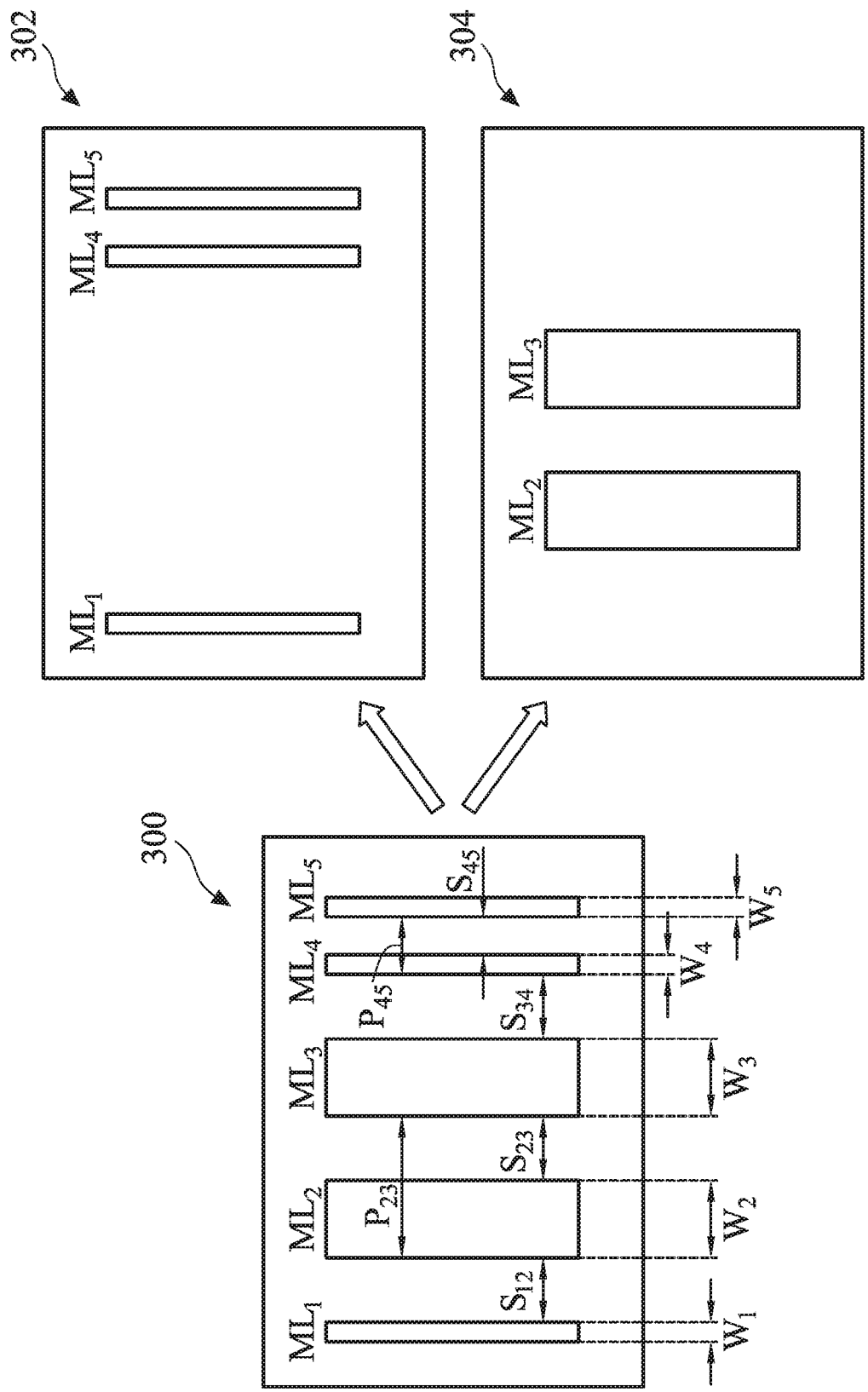
FIG. 3 illustrates an exemplary IC layout and associated sub-layouts according to various aspects of the present disclosure.

Referring to FIG. 2, at operation 202, the method 200 is provided with a layout of an IC. Referring to FIG. 3, an exemplary layout 300 includes geometrical patterns (rectangles in this embodiment) $ML_1$, $ML_2$, $ML_3$, $ML_4$, and $ML_5$, each representing a metal line. Each of the metal lines has a width. Particularly, the metal line $ML_1$ has a width $W_1$, the metal line $ML_2$ has a width $W_2$, the metal line $ML_3$ has a width $W_3$, the metal line $ML_4$ has a width $W_4$, and the metal line $ML_5$ has a width $W_5$. Further, in this embodiment, the widths $W_1$, $W_4$, and $W_5$ are smaller than a predetermine value X, while the widths $W_2$ and $W_3$ are equal to or greater than the predetermined value X. X represents a smallest width that is suitable for a metal line to be formed by a damascene method. For example, X is about 2.5 times of minimum metal line CD. If X is smaller than 2.5 times of minimum metal line CD, a metal line formed by damascene method will face the narrow opening filling difficulties discussed above. In the illustrated embodiment, the metal line CD is about 10 nm and X is about 25 nm. Each of the widths $W_1$, $W_4$, and $W_5$ ranges from about 10 nm to about 20 nm, such as equals to the metal line CD at about 10 nm. Each of the widths $W_2$ and $W_3$ ranges from about 25 nm to about 1 micron (um), such as from 100 nm to 1 um. A ratio of a width of metal line $ML_2$ or $ML_3$ is at least 2.5 times of a width of metal line $ML_1$, $ML_4$, or $ML_5$, such that width of metal line $ML_2$ or $ML_3$ is not too small for damascene process.

The metal lines are spaced from each other. Particularly, the patterns $ML_1$ and $ML_2$ are spaced by a distance (or spacing) $S_{12}$, the patterns $ML_2$ and $ML_3$ are spaced by a distance $S_{23}$, the patterns $ML_3$ and $ML_4$ are spaced by a distance $S_{34}$, and the patterns $ML_4$ and $ML_5$ are spaced by a distance $S_{45}$. Further, in this embodiment, the distance $S_{45}$ is smaller than the distance $S_{23}$. In a specific example, $W_2$ equals $W_3$, $M_4$ equals $M_5$, and $W_2+S_{23}$ defines a first pitch $P_{23}$, $W_4+S_{45}$ defines a second pitch $P_{45}$ that is smaller than the first pitch $P_{23}$.

Referring back to FIG. 2, at operation 204, the method 200 classifies each metal line as either a narrow metal line or a wide metal line by comparing its width to the predetermined value X. In the illustrated embodiment, each of the metal lines $ML_1$, $ML_4$, and $ML_5$ has a width less than X. Therefore, each of the metal lines $ML_1$, $ML_4$, and $ML_5$ is classified as a narrow metal line. Similarly, each of the metal lines $ML_2$ and $ML_3$ has a width equal to or larger than X. Therefore, each of the metal lines $ML_2$ and $ML_3$ is classified as a wide metal line.

At operation 206, the method 200 decomposes the IC layout into two sub-layouts, one including all the narrow metal lines and another one including all the wide metal lines. Referring to FIG. 3, the exemplary layout 300 is decomposed into a sub-layout 302 and a sub-layout 304. The sub-layout 302 includes all the narrow metal lines classified in operation 204, such as metal lines $ML_1$, $ML_4$, and $ML_5$. In the sub-layout 302, the metal lines $ML_1$ and $ML_4$ originally separated by metal lines $ML_2$ and $ML_3$ in the exemplary layout 300 become adjacent metal lines. The sub-layout 304 includes all the wide metal lines classified in operation 204, such as metal lines $ML_2$ and $ML_3$. The sub-layouts 302 and 304 (in GDSII file format or DFII file format) are subsequently sent to mask fabrication 144 (FIG. 1) to create two corresponding masks.

Figure 4:
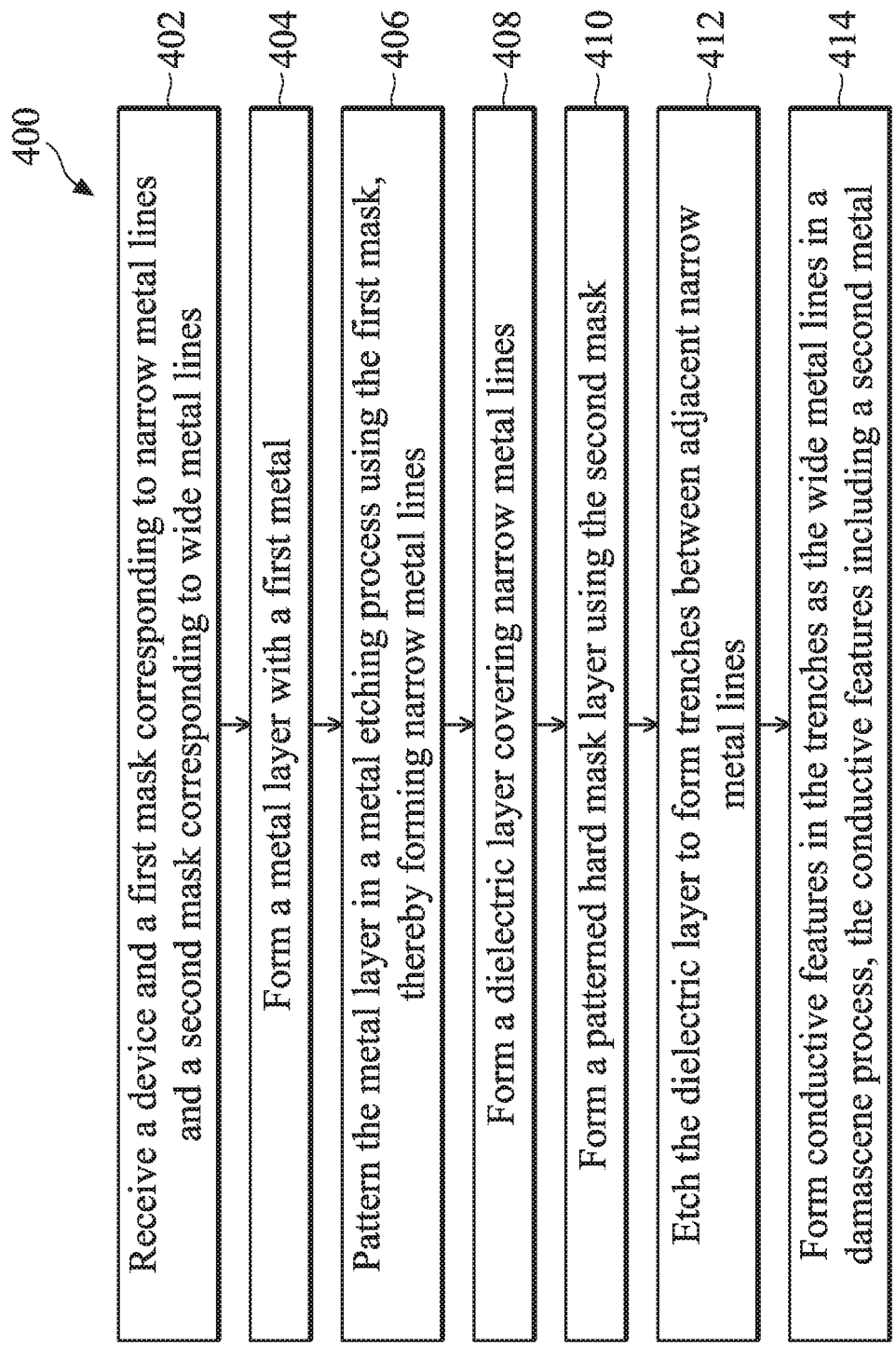
FIG. 4 is a flow chart of a hybrid method for forming interconnect structure according to various aspects of the present disclosure.

FIG. 4 illustrate a flow chart of a method 400, constructed according to various aspects of the present disclosure. The method 400 is a hybrid method that utilizes the two masks representing two sub-layouts created in the method 200. Embodiments of the method 400 may be implemented by the fab 150 (FIG. 1). The method 400 is an example, and is not intended to limit the present disclosure beyond what is explicitly recited in the claims. Additional operations can be provided before, during, and after the method 400, and some operations described can be replaced, eliminated, or relocated for additional embodiments of the method. The method 400 is described below in conjunction with FIGS. 5-20, which graphically illustrate some principles of the method 400. FIGS. 5-20 illustrate sectional views of an exemplary integrated circuit 500 during various fabrication stages of the method 400 in accordance with some embodiments.

Figure 5:
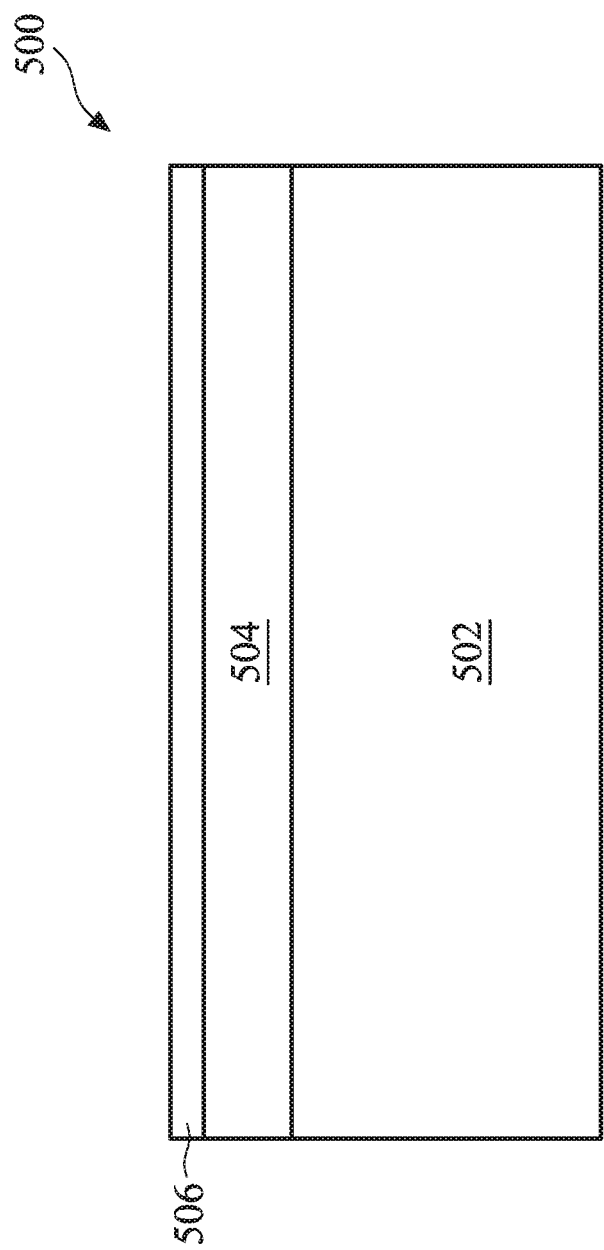
FIGS. 5, 6, 7, 8, 9, 10, 11, 12, 13, 14, 15, 16, 17, 18, 19, and 20 are cross-sectional views of a portion of a semiconductor device in various fabrication stages according to an embodiment of the method in FIG. 4.
Figure 6:
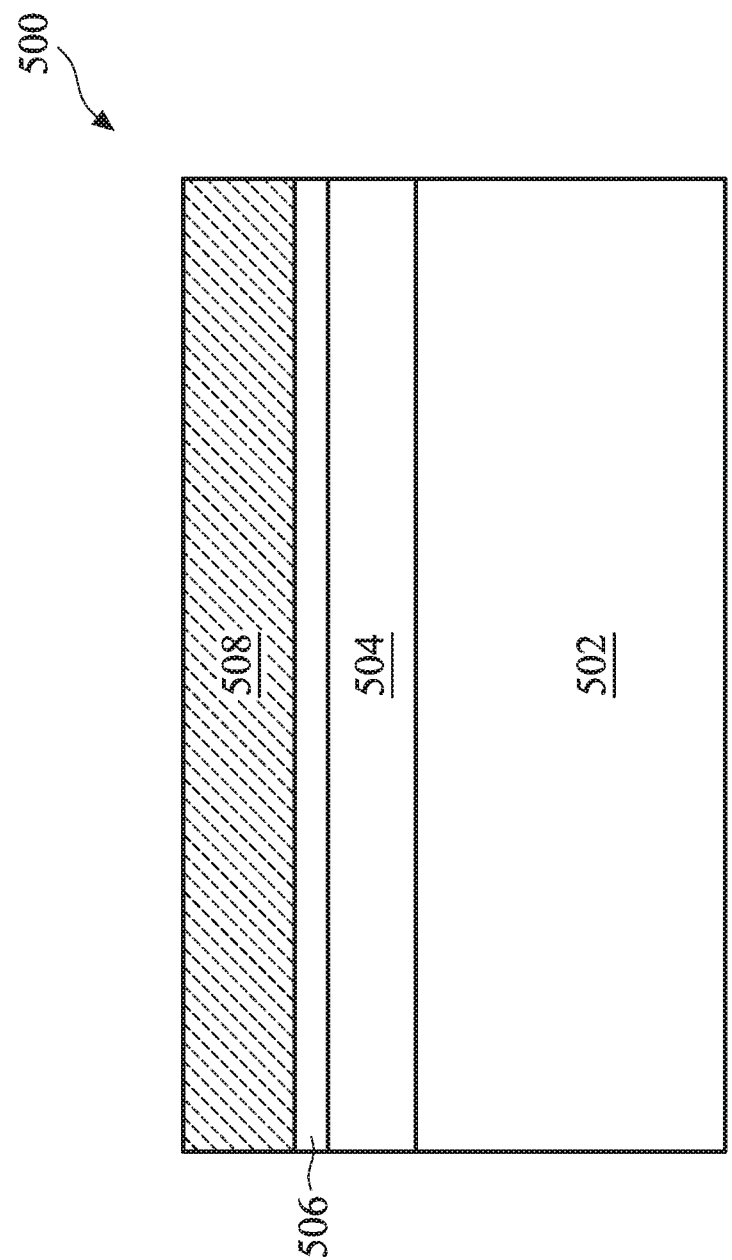

Referring to FIG. 5, the method 400 begins at operation 402 by providing or receiving a device 500 including a substrate 502 as illustrated in FIG. 5. In some embodiments, the substrate 502 includes silicon. Alternatively, the substrate 502 may include other elementary semiconductor such as germanium in accordance with some embodiments. In some embodiments, the substrate 502 additionally or alternatively includes a compound semiconductor such as silicon carbide, gallium arsenic, indium arsenide, and indium phosphide. In some embodiments, the substrate 502 includes an alloy semiconductor such as silicon germanium, silicon germanium carbide, gallium arsenic phosphide, and gallium indium phosphide.

In some embodiments, the substrate 502 includes a semiconductor-on-insulator (SOI) structure. For example, the substrate may include a buried oxide (BOX) layer formed by a process such as separation by implanted oxygen (SIMOX). In various embodiments, the substrate 502 includes various p-type doped regions and/or n-type doped regions, such as p-type wells, n-type wells, p-type source/drain features and/or n-type source/drain features, formed by a process such as ion implantation and/or diffusion. The substrate 502 may further include other functional features such as a resistor, a capacitor, diode, transistors, such as field effect transistors (FETs). The substrate 502 may include lateral isolation features configured to separate various devices formed on the substrate 502.

The device 500 includes a dielectric layer 504 deposited above the substrate 502. In some embodiments, the dielectric layer 504 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 504 may be formed by PECVD, FCVD, or other suitable methods. In some embodiments, the dielectric layer 504 is formed of a low-k (e.g., a dielectric constant value around 3.5) dielectric layer or an extreme low-k (e.g., a dielectric constant value around 2.5) dielectric layer, such as carbon-containing dielectric materials, and may further contain nitrogen, hydrogen, oxygen, and combinations thereof. If an extreme low-k dielectric layer is used, a curing process may be followed after depositing the extreme low-k dielectric layer to increase its porosity, lower the k value, and improve the mechanical strengths. The operation 402 may also include performing one or more chemical-mechanical polishing (CMP) processes to planarize the top surface of the device 500.

In some embodiments, the dielectric layer 504 is an inter-metal dielectric (IMD) layer that includes interconnect structures. In some embodiments, the dielectric layer 504 may include a plurality of IMD layers, not limited to the single IMD layer illustrated in the present embodiment. Each of the IMD layer may have a thickness ranging from about 300 nm to about 1800 nm. The IMD layers provide electrical insulation as well as structural support for a multi-layer interconnect structures. Multi-layer interconnect structures may include a plurality of metallization layers and may further include vias or contacts of the interconnect feature (e.g., back-end-of-the-line (BEOL) features) disposed in the IMD layers. For example, an upper metallization layer (e.g., metal 4 ($M_4$), metal 5 ($M_5$), etc.) includes a plurality of conductive features (e.g., metal lines, contacts, and/or vias) embedded in the IMD layers.

A top portion of the dielectric layer 504 may include an etch stop layer 506. The etch stop layer 506 functionally provides isolation for the lower portion of the dielectric layer 504 as a barrier layer and also provides end point control during subsequent etching processes. Material compositions of an etch stop layer are selected such that an etch selectivity exists between the etch stop layer and the material layer to form thereon, such that an etching process etching through the material layer thereon would stop at the etch stop layer without causing etching damages to the underlaying dielectric layer(s). The etch stop layer 506 may comprise silicon nitride, silicon oxynitride, silicon carbide, silicon carbon nitride, metal oxide (e.g., AlOx), metal oxynitride (e.g., AlOxNy), and/or other suitable materials. In some embodiments, the etch stop layer 506 has a thickness ranging from about 10 nm to about 100 nm, such as about 50 nm.

At operation 404, the method 400 (FIG. 4) forms a metal layer 508 over the etch stop layer 506. As will be discussed in later section of the present disclosure, the metal layer 508 is to pattern into metal lines representing those classified as narrow metal lines in method 200 (FIG. 2). In some embodiments, the metal layer 508 includes pure noble metal, or alloy of noble metals with noble or non-noble metals. As used herein, the term "noble metal" means a metal selected from the group of ruthenium (Ru), rhodium (Rh), palladium (Pd), osmium (Os), iridium (Ir), and platinum (Pt). Noble metals have become technologically important as conductive features in integrated circuits. Unlike some other non-noble metals, such as copper, which is not suitable for direct patterning, noble metals can be patterned to form metal lines with a CD less than about 20 nm due to the suitability of being directly patterned in dry-etching approaches (e.g., reactive ion etching (RIE) process). In the illustrated embodiment, the metal layer 508 includes a noble metal selected from the group of Ru, Ir, Rh, and Pt. In another embodiment, the metal layer 508 includes alloy of noble metals with noble or non-noble metals, such as PtIr, PdPt, or PdNi. In yet another embodiment, the metal used to form the metal layer 508 is not limited to noble metals, as long as the metal is suitable for direct patterning, such as Cobalt (Co), Molybdenum (Mo), and Tungsten (W). The metal layer 508 may be deposited by chemical vapor deposition (CVD), physical vapor deposition (PVD), electroplating, or other suitable methods. The metal layer 508 may have a thickness ranging from about 15 nm to about 80 nm.

Figure 7:
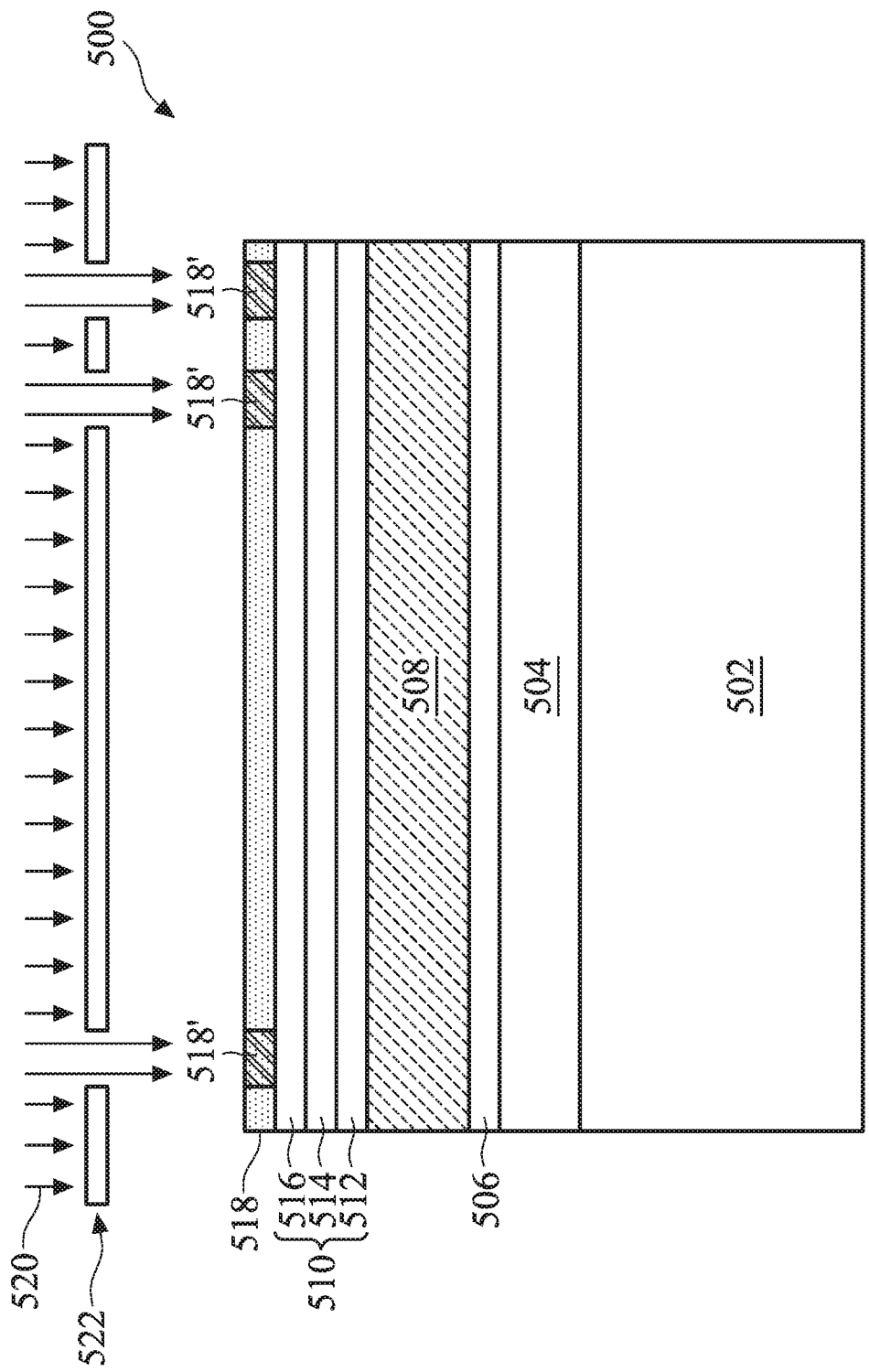

At operation 406, the method 400 (FIG. 4) patterns the metal layer 508 to form narrow metal lines in a metal etching process. Referring to FIG. 7, operation 406 starts with forming a hard mask layer (e.g., a tri-layer hard mask) 510 on the metal layer 508. Any suitable material or composition may be used in the hard mask layer 510, and the illustrated tri-layer hard mask is one such example. The exemplary hard mask layer 510 includes a bottom layer 512, a middle layer 514, and a top layer 516, each with different or at least independent materials. For example, the bottom layer 512 may include tetraethyl orthosilicate (TEOS), a nitrogen free anti-reflective coating (NFAARC) film, oxygen-doped silicon carbide (ODC), silicon carbon nitride (SiCN), or plasma-enhanced oxide (PEOx); the middle layer 514 may include a silicon rich polymer material (e.g., $SiC_xH_yO_z$); the top layer 516 may include tetraethyl orthosilicate (TEOS) or silicon oxide ($SiO_2$). It is understood that in other embodiments, one or more layers may be omitted and that additional layers may be provided as a part of the tri-layer hard mask.

The hard mask layer 510 may subsequently be patterned using suitable processes including double-patterning processes, multi-patterning processes, photolithography, self-aligned processes, and mandrel-spacer processes to define a pattern of narrow lines to be transferred to the underneath metal layer 508. In the illustrated embodiment, operation 406 patterns the hard mask layer 510 in a lithography process and an etching process. A photoresist layer 518 is formed on the hard mask layer 510 using a spin-coating process and soft baking process. Then, the photoresist layer 518 is exposed to a radiation 520. The radiation 520 is masked by a photomask 522 fabricated in a mask house 130 (FIG. 1) based on the sub-layout 302 (FIG. 3), such that only a portion of the photoresist layer 518 (e.g., areas 518') is exposed in the radiation 520. The radiation 520 may be an extreme ultraviolet (EUV) radiation using a wavelength of 13.6 nm, an ultraviolet radiation using a wavelength of 436 nm, 405 nm, or 365 nm, or a DUV radiation using a wavelength of 248 nm, 193 nm, or 157 nm, or other available radiation for lithography, such as e-beam. In the case of e-beam lithography (which is maskless lithography), the "photomask" is in the form of a direct-write data pattern based on the sub-layout 302 (FIG. 3) rather than a physical apparatus.

Figure 8:
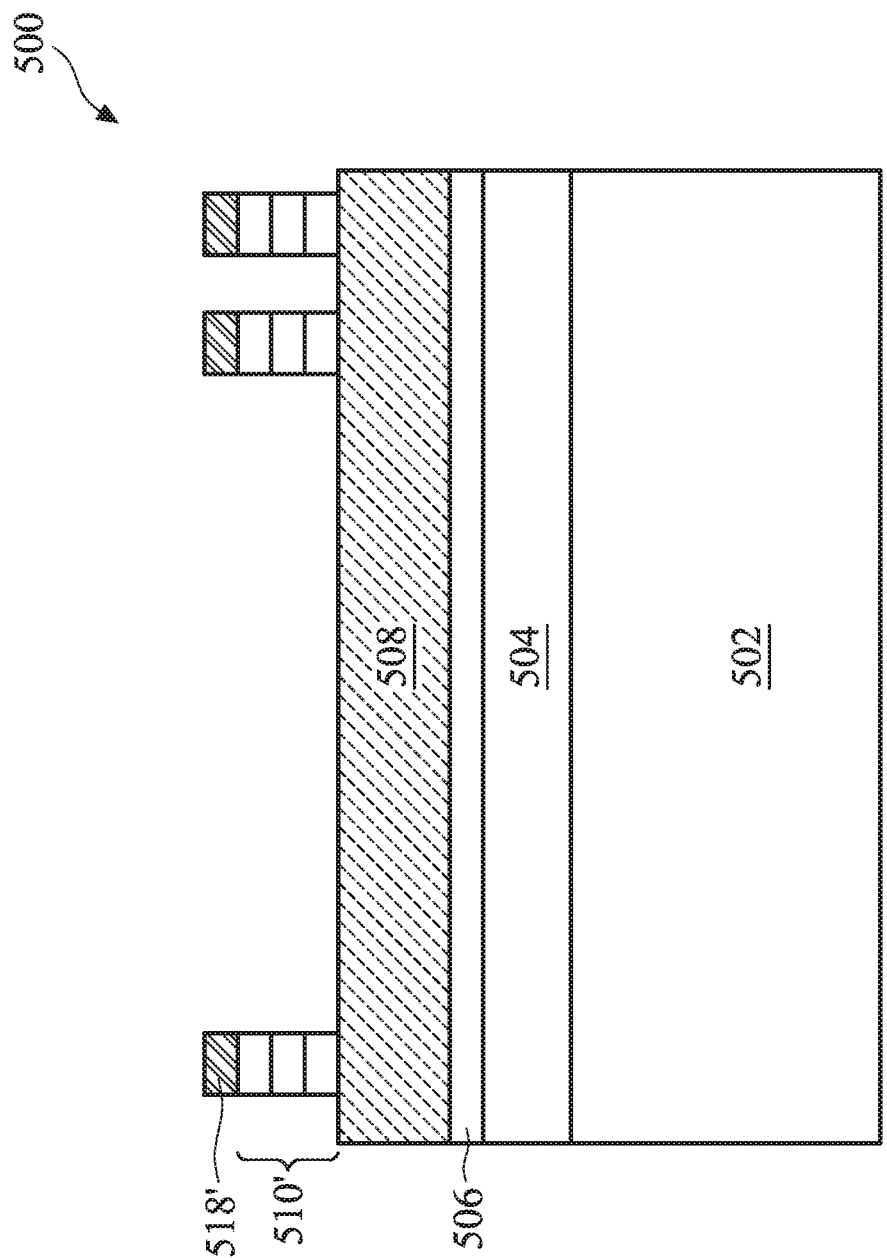

Referring to FIG. 8, in the illustrated embodiment, the exposed photoresist layer 518 is developed using post-exposure baking (PEB), developing, and hard baking thereby forming a patterned photoresist layer 518' over the hard mask layer 510. The patterned photoresist layer 518' defines a pattern of narrow lines, which will be transferred to the hard mask layer 510 first and eventually to the metal layer 508. Subsequently, the hard mask layer 510 is etched through the openings of the patterned photoresist layer 518', forming a patterned hard mask layer 510'. The patterned photoresist layer 518' is removed thereafter using a suitable process, such as wet stripping or plasma ashing. In one example, the etching process includes applying a dry (or plasma) etch to remove the hard mask layer 510 within the openings of the patterned photoresist layer 518'. In another example, the etching process includes applying a wet etch with a hydrofluoric acid (HF) solution to remove the hard mask layer 510 within the openings of the patterned photoresist layer 518'.

Figure 9:
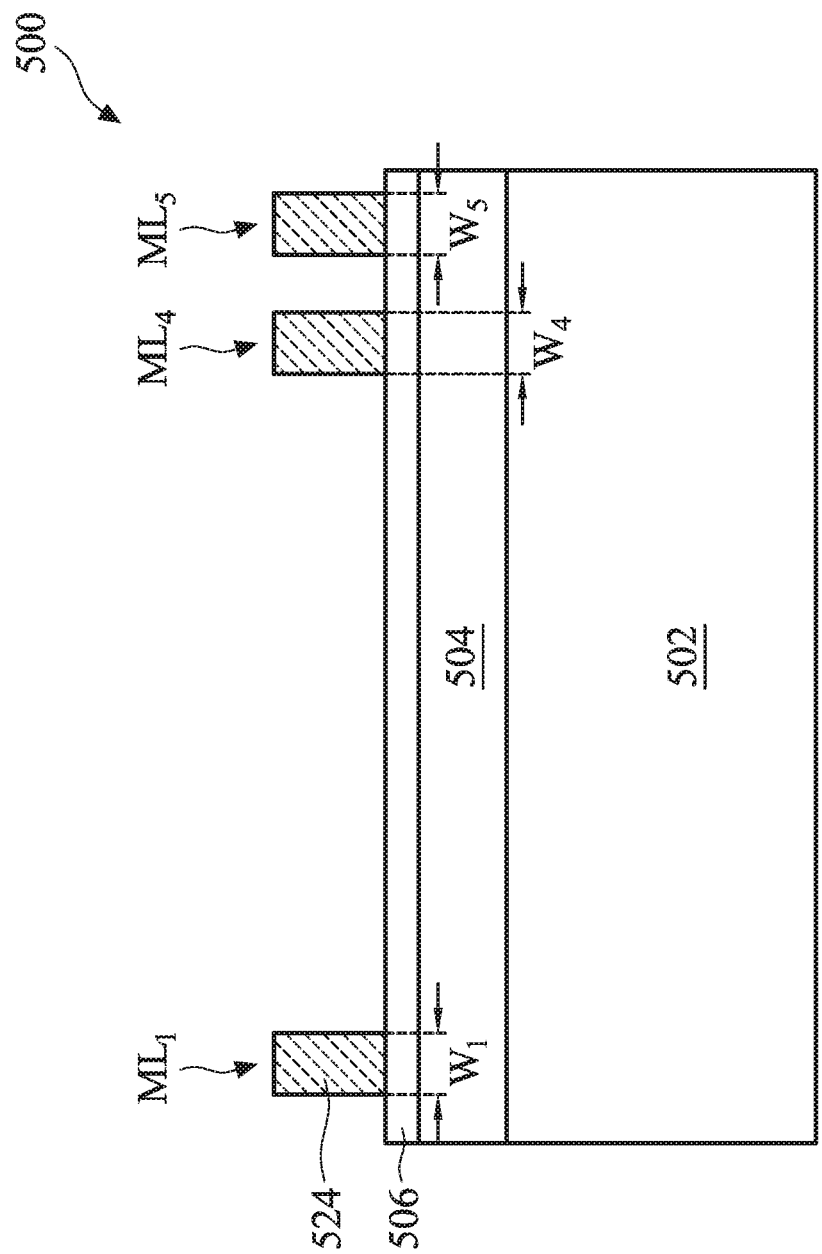

Subsequently, operation 406 etches the metal layer 508 in a metal etching process, using the patterned hard mask layer 510' as an etch mask. In the illustrated embodiment, the metal etching process is a dry etching process, such as a plasma etching process. In furtherance of the embodiment, the metal etching process includes an RIE process. The RIE process may include process parameters such as reactor operating pressure ranging from about 10 mTorr to about 300 mTorr, an RF power less than 2700 W (e.g., ranging from about 900 W to about 1600 W), a bias voltage less than about 4500 W, a temperature ranging from about 10 degrees Celsius to about 80 degrees Celsius, and an RIE etching period ranging from about 200 seconds to about 500 seconds. The RIE source gas may include an ion composition, such as argon (Ar), a fluorine-containing gas (e.g., $CF_4$, $SF_6$, $CH_2F_2$, $CHF_3$, $C_4F_8$, $C_2F_6$), or a combination thereof. The RIE source gas may further include certain chemical etchants, such as a chlorine-containing gas (e.g., $Cl_2$, $CHCl_3$, $CCl_4$) for chemical etching. In some embodiments, the chemical etchant comprises boron (B) (e.g., $B_2F_4$, $BCl_3$, $B_4Cl_4$, $BBr_3$). In a specific embodiment, the chemical etchant comprises a combination of boron and chlorine. In some embodiments, the total etchant flow rate is less than 1800 sccm, such as about 1200 sccm. The chemical etchant may have a flow rate about 30% to about 50% of the total etchant flow rate, such as about 40%. The etching of the hard mask layer 510 and the metal layer 508 may be in-situ. The resulting metal lines 524 in the patterned hard mask is shown in FIG. 9, where each of the metal lines 524 corresponds to a narrow metal line (e.g, $ML_1$, $ML_4$, or $ML_5$) defined in the sub-layout 302 (FIG. 3). Even though widths of the metal lines 524 (e.g., $W_1$, $W_4$, or $W_5$) may be within sub-20 nm range, the selection of metal compositions (e.g., noble metal) for the metal layer 508 results in bulk metal for each narrow metal line which still ensures low resistivity.

Figure 10:
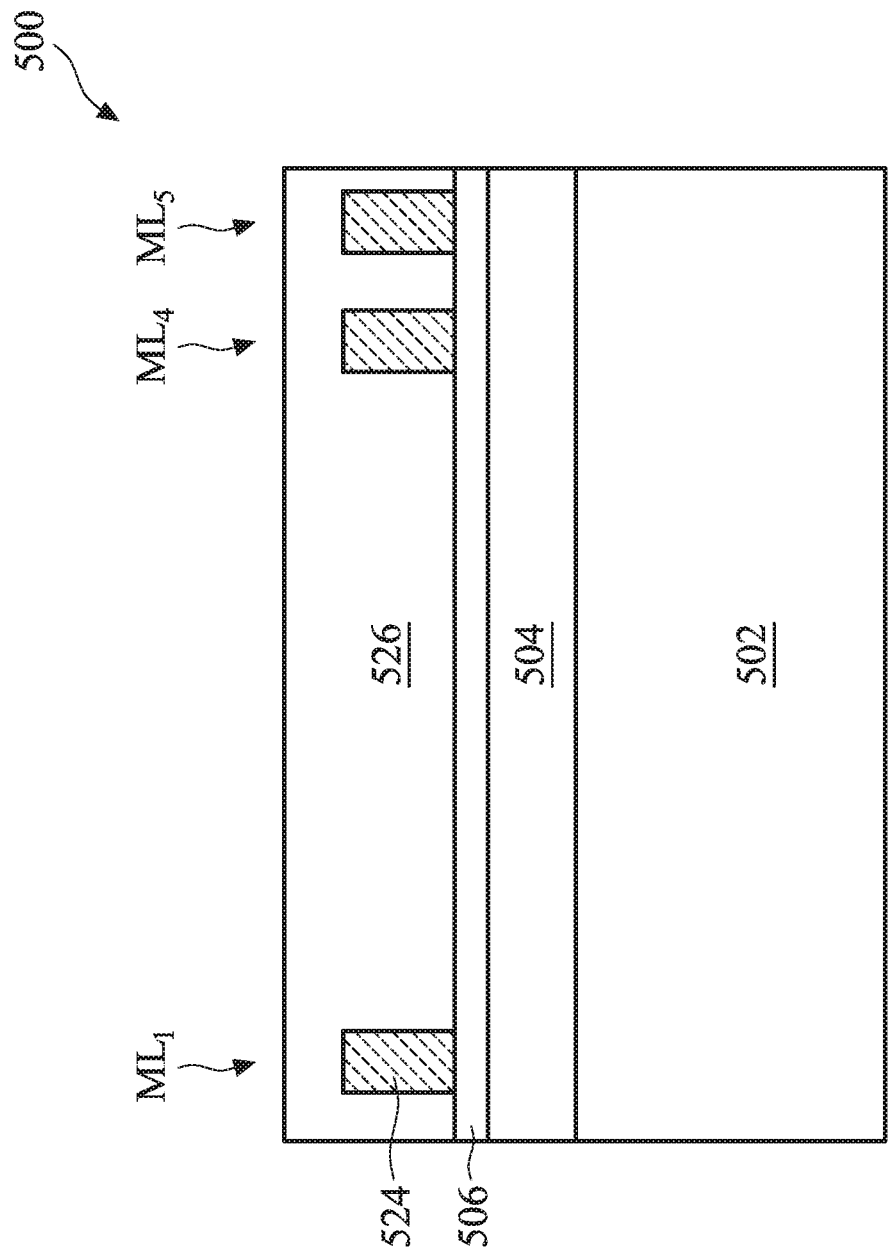
Figure 11:
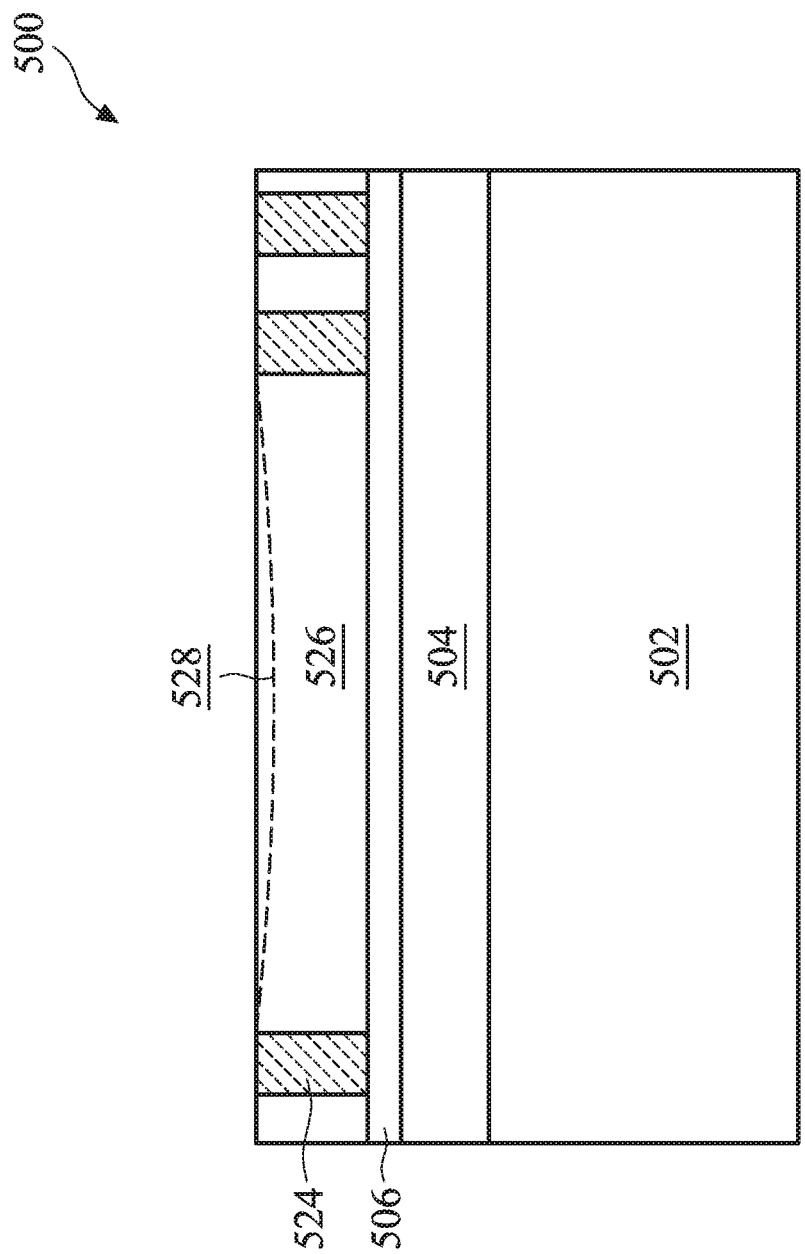

At operation 408, the method 400 (FIG. 4) deposits a dielectric layer 526 covering sidewalls and top surfaces of the metal lines 524, such as shown in FIG. 10. In some embodiments, the various material compositions of the dielectric layer 526 are similar to what have been discussed above with reference to the dielectric layer 504 in FIG. 1. Alternatively, the dielectric layer 526 may include a high-k dielectric material such as zirconium oxide ($ZrO_2$). In some other embodiments, the dielectric layer 526 may optionally include silicon oxide ($SiO_2$), silicon nitride ($Si_3N_4$), silicon oxynitride (SiON), or combinations thereof. A variety of suitable processes including chemical vapor depositions (CVD), low-pressure CVD (LPCVD), plasma-enhanced CVD (PECVD), and atomic layer deposition (ALD) may be used to form the dielectric layer 526. A CMP process may be performed to remove excessive dielectric layer 526 and/or planarize a top surface of the device 500. The metal lines 524 may function as a CMP stop layer. The resulting device 500 after the CMP process is shown in FIG. 11, where top surfaces of the metal lines 524 are exposed. The portion of dielectric layer 526 between $ML_1$ and $ML_4$, may suffer more CMP loss than other portions due to the lower metal density between $ML_1$ and $ML_4$ and have a dishing profile (denoted by dotted line 528). A depth of the dishing profile may range from about 0.1 nm to about 10 nm.

Figure 12:
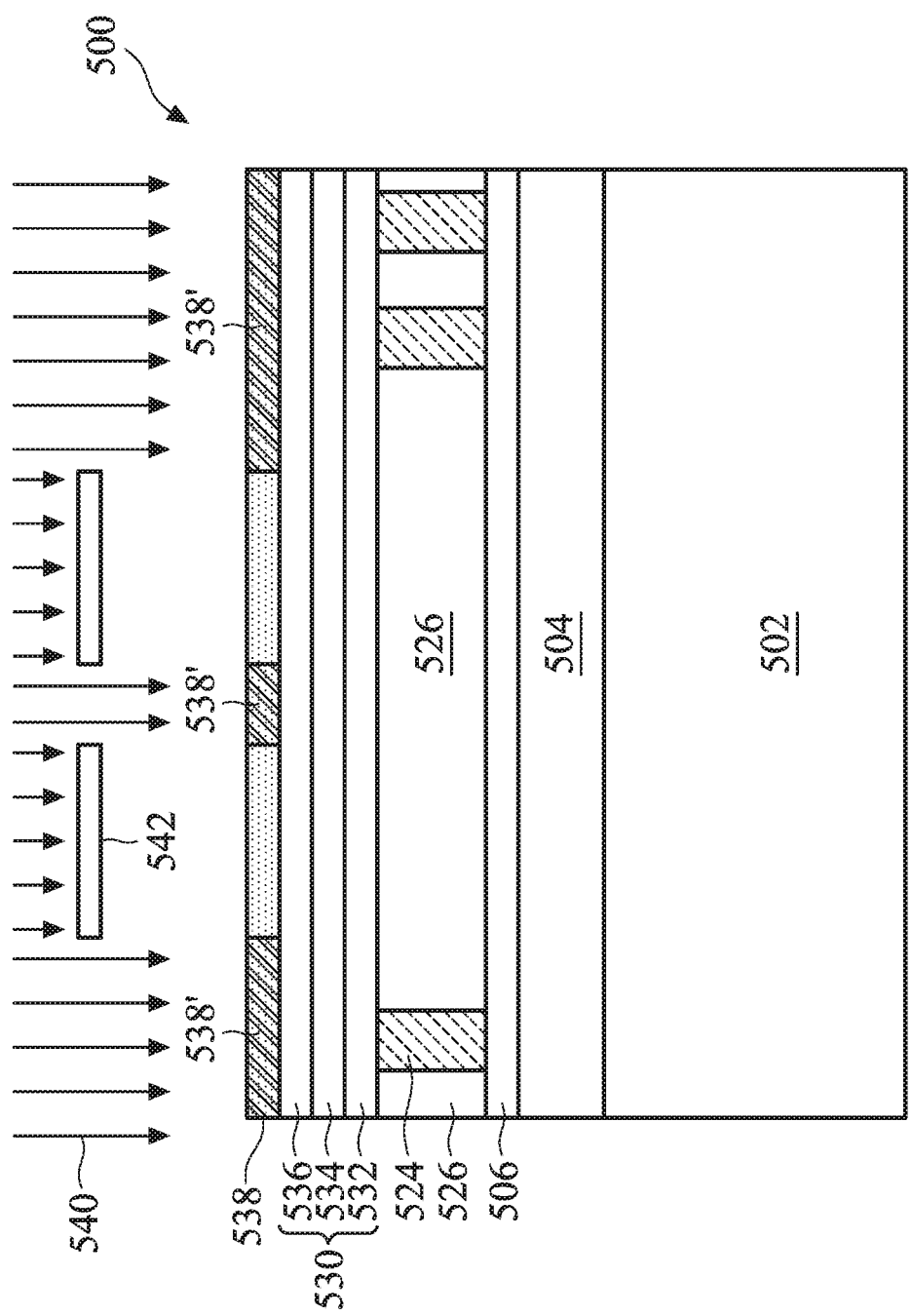

At operation 410, the method 400 (FIG. 4) forms a hard mask layer 530 on the dielectric layer 526 and the metal lines 524, as shown in FIG. 12. In some embodiments, the various material compositions of the hard mask layer 530 are similar to what have been discussed above with reference to the hard mask layer 510 in FIG. 7. In the illustrated embodiment, the hard mask layer 530 is a tri-layer hard mask, which includes a bottom layer 532, a middle layer 534, and a top layer 536, each with different or at least independent materials. For example, the bottom layer 532 may include tetraethyl orthosilicate (TEOS), a nitrogen free anti-reflective coating (NFAARC) film, oxygen-doped silicon carbide (ODC), silicon carbon nitride (SiCN), or plasma-enhanced oxide (PEOx); the middle layer 534 may include a silicon rich polymer material (e.g., $SiC_xH_yO_z$); the top layer 536 may include tetraethyl orthosilicate (TEOS) or silicon oxide ($SiO_2$). It is understood that in other embodiments, one or more layers may be omitted and that additional layers may be provided as a part of the tri-layer hard mask.

The hard mask layer 530 may subsequently be patterned using suitable processes including double-patterning processes, multi-patterning processes, photolithography, self-aligned processes, and mandrel-spacer processes to define a pattern to be transferred to the underneath dielectric layer 526 to form trench-like openings to deposit metal lines therein. In the illustrated embodiment, operation 410 patterns the hard mask layer 530 in a lithography process and an etching process. A photoresist layer 538 is formed on the hard mask layer 530 using a spin-coating process and soft baking process. Then, the photoresist layer 538 is exposed to a radiation 540. The radiation 540 is masked by a photomask 542 fabricated in a mask house 130 (FIG. 1) based on the sub-layout 304 (FIG. 3), such that only a portion of the photoresist layer 538 (e.g., areas 538') is exposed in the radiation 520. The radiation 520 may be an extreme ultraviolet (EUV) radiation using a wavelength of 13.6 nm, an ultraviolet radiation using a wavelength of 436 nm, 405 nm, or 365 nm, or a DUV radiation using a wavelength of 248 nm, 193 nm, or 157 nm, or other available radiation for lithography, such as e-beam. In the case of e-beam lithography (which is maskless lithography), the "photomask" is in the form of a direct-write data pattern based on the sub-layout 304 (FIG. 3) rather than a physical apparatus. In the illustrated embodiment, photomask 542 and photomask 522 (FIG. 7) are of opposite types, such that opaque portions of the photomask 542 correspond to metal lines in sub-layout 304, while transparent portions of the photomask 522 correspond to metal lines in sub-layout 302.

Figure 13:
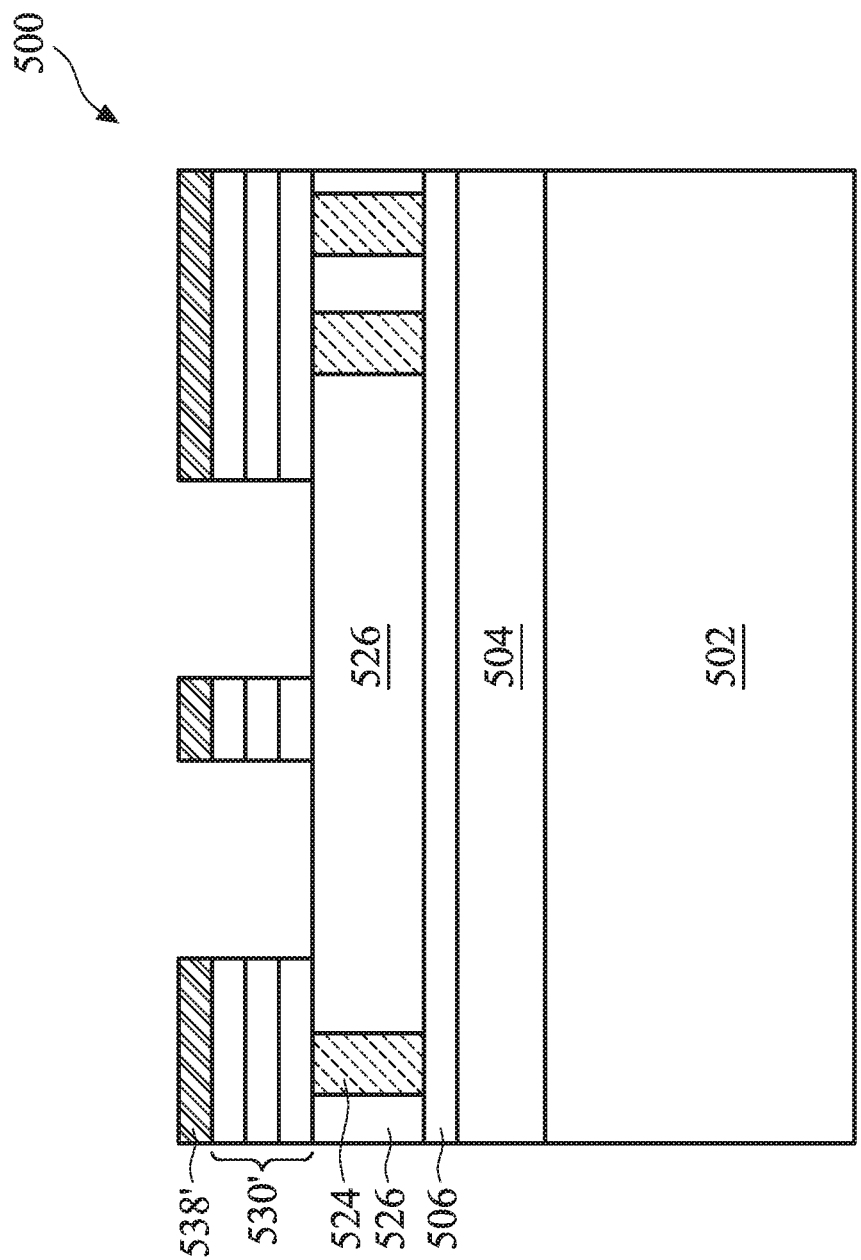

Referring to FIG. 13, in the illustrated embodiment, the exposed photoresist layer 538 is developed using post-exposure baking (PEB), developing, and hard baking thereby forming a patterned photoresist layer 538' over the hard mask layer 530. Opening in the patterned photoresist layer 538' defines a pattern of wide lines, which will be transferred to the hard mask layer 530 first and then to the dielectric layer 526. Subsequently, the hard mask layer 530 is etched through the openings of the patterned photoresist layer 538', forming a patterned hard mask layer 530'. The patterned photoresist layer 538' is removed thereafter using a suitable process, such as wet stripping or plasma ashing. In one example, the etching process includes applying a dry (or plasma) etch to remove the hard mask layer 530 within the openings of the patterned photoresist layer 538'. In another example, the etching process includes applying a wet etch with a hydrofluoric acid (HF) solution to remove the hard mask layer 530 within the openings of the patterned photoresist layer 538'.

Figure 14:
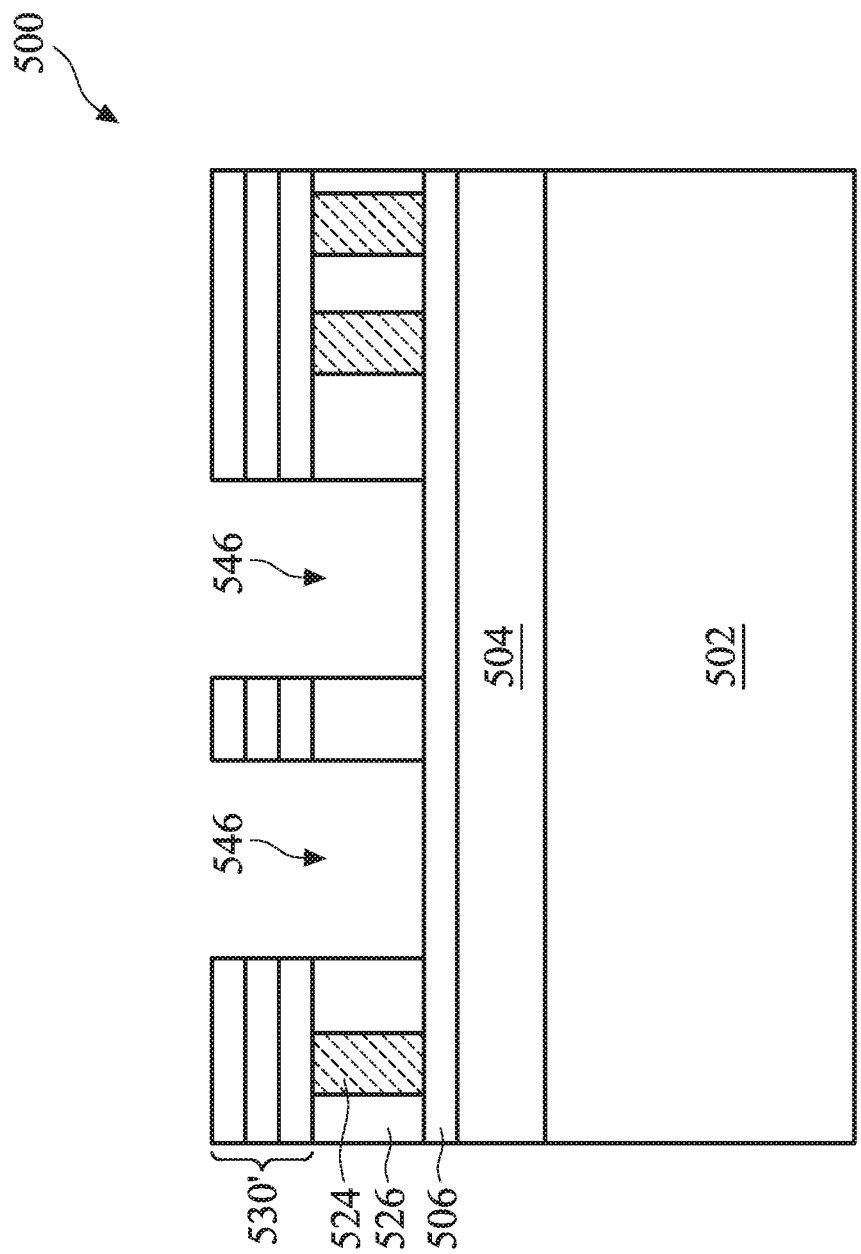

At operation 412, the method 400 (FIG. 4) etches the dielectric layer 526 using the patterned hard mask layer 530' as a mask to form trench-like openings 546 (also referred to as trenches 546) between adjacent narrow metal lines 524, as shown in FIG. 14. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. As will be explained in further detail below, the trenches 546 between adjacent narrow metal lines 524 will be subsequently filled with conductive materials, such as copper, to form wide metal lines.

Figure 15:
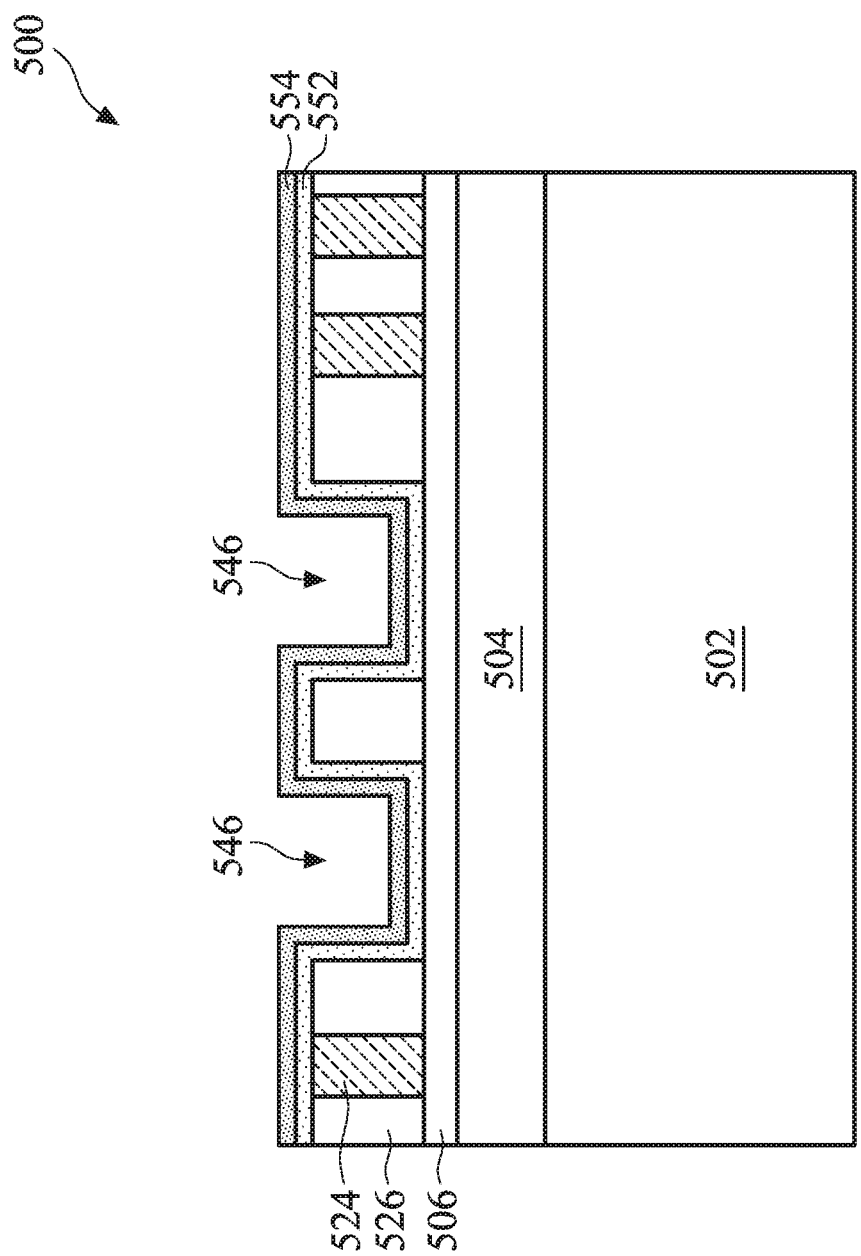
Figure 16:
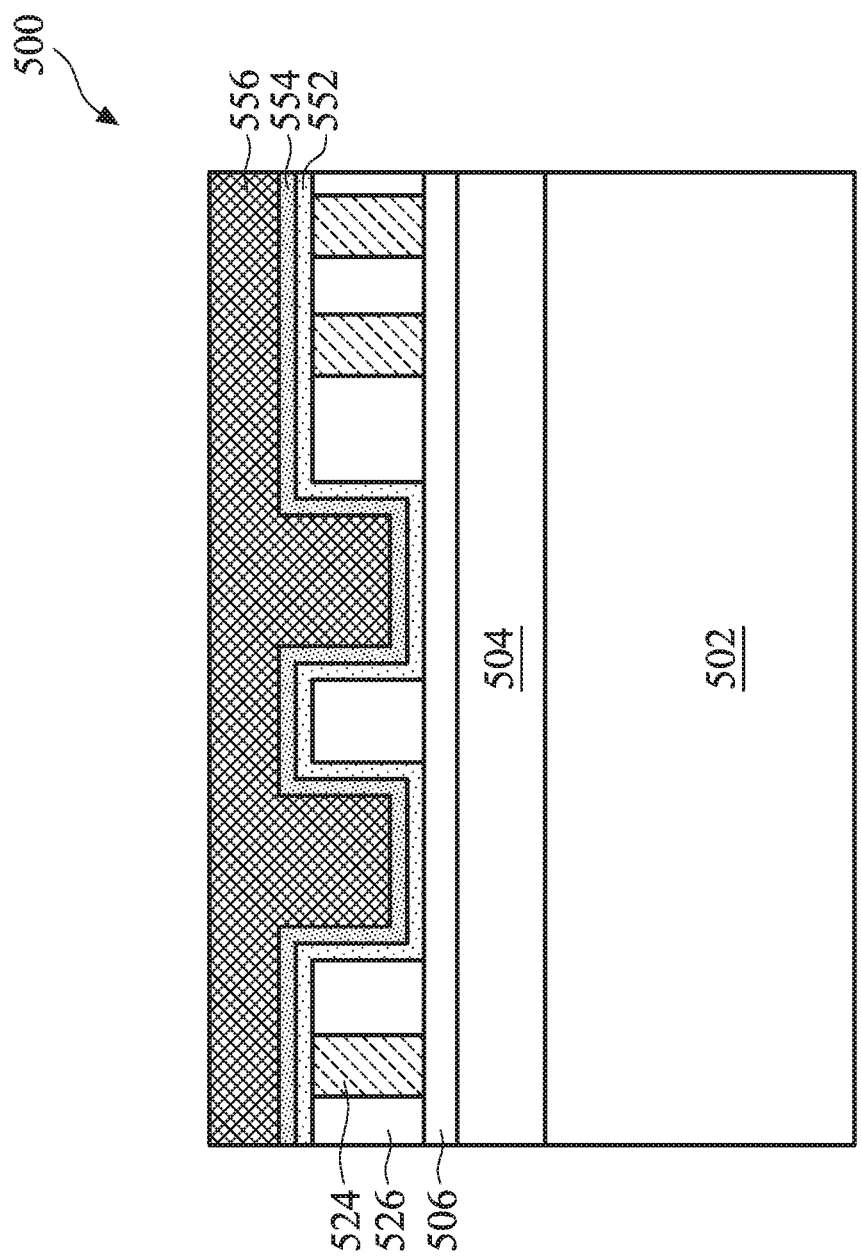
Figure 17:
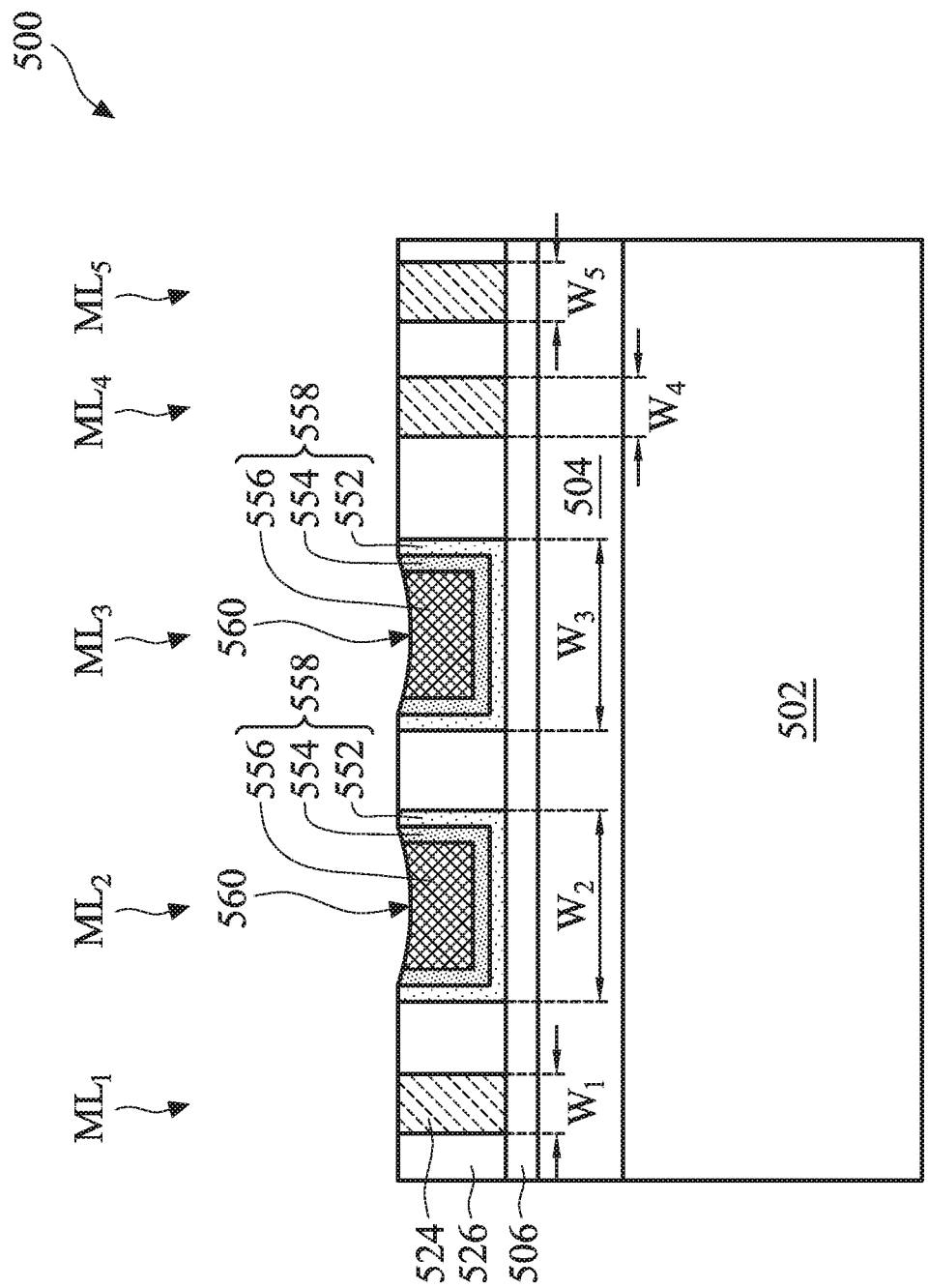

At operation 414, the method 400 (FIG. 4) forms conductive features in the trenches 546 as the wide metal lines in a damascene process. Referring to FIG. 15, a conductive liner layer 552 may be deposited prior to filling the trenches 546. The conductive liner layer 552 is conformally over the device 500 as a blanket layer, and may comprise a single layer of Ta, TaN, WnN, TiN, or any combinations thereof. The conductive liner layer may be typically used as a barrier layer for preventing the conductive material such as copper from diffusing into the neighboring dielectric layer 526 and the underlying substrate. The conductive liner layer 552 may be deposited by using suitable deposition process such as CVD, PVD, atomic layer deposition (ALD), or other suitable methods. The conductive liner layer 552 may have a thickness in a range from about 5 Å to about 35 Å. Optionally, operation 414 may form an adhesion layer 554 conformally over the conductive liner layer 552 as a blanket layer, and may comprise a single layer of Co, Mn, Ti, Ru, Ir, or any combination thereof. The adhesion layer may be formed by suitable deposition techniques such as PVD, CVD and/or the like. The adhesion layer may have a thickness in a range from about 5 Å to about 35 Å. In addition, the adhesion layer 554 may be alloyed with a material that improves the adhesive properties of the seed layer so that it can act as an adhesion layer. For example, the adhesion layer 554 may be alloyed with a material such as manganese or aluminum, which will migrate to the interface between the adhesion layer 554 and the conductive liner layer 552 and will enhance the adhesion between these two layers. The alloying material may be introduced during formation of the adhesion layer 554. The alloying material may comprise no more than about 10% of the adhesion layer 554.

Operation 414 subsequently fill a conductive material in the trenches 546 and cover the device 300 as a bulk metal layer 556. The conductive material may be deposited through suitable techniques such as an electroplating process, PVD, or other suitable methods. One advantageous feature of having the bulk metal layer 556 formed in a damascene process shown is that the conductive material (e.g., Copper) selected may not otherwise be suitable for metal etching. In comparison with conventional etching-based techniques, the total production time of the semiconductor device is reduced. Moreover, without an etching process commonly used in the traditional fabrication process, the resolution of metal lines may be improved. In various embodiments, the conductive material is different from the metal used in the narrow metal lines 524. In some embodiments, the narrow metal lines 524 includes one or more noble metals as discussed above, while the bulk metal layer 556 includes one or more non-noble metals. For example, the bulk metal layer 556 may include copper (Cu), although other suitable materials such as cobalt (Co), Nickel (Ni), Silver (Ag), aluminum (Al), combinations thereof, and/or the like, may alternatively be utilized. In some embodiments, the bulk metal layer 556 also includes a noble metal but different from the one used in the narrow metal lines 524. For example, the bulk metal layer 556 may include Pt, while the narrow metal lines 524 may include Ru, Ir, or Rh. In some alternative embodiments, the narrow metal lines 524 and the bulk metal layer 556 both include non-noble, but indecently different, metals. For example, the narrow metal lines 524 may include Mo or W, while the bulk metal layer 556 may include Cu.

A CMP process is then performed to remove excess conductive materials from the top portion of the bulk metal layer 556. The conductive liner layer 552 and the adhesion layer 554 are also removed from above the narrow metal lines 524, such that narrow metal lines 524 are exposed. The remaining portion of the bulk metal layer 556 in the trenches 546 together with the surrounding conductive liner layer 552 and the adhesion layer 554 form the wide metal lines 558, such as the metal lines $ML_2$ and $ML_3$ in the illustrated embodiment. In some embodiments, a top surface of the wide metal lines 558 is configured to have a dishing profile (or a recess) 560. In other words, instead of planarizing the top surface of the wide metal lines 558, the CMP process may form a recess (the dishing profile 560) in the wide metal lines 558 (e.g., in the bulk metal layer 556) such that its top surface is not leveled with the top surface of the rest of the device 500 (e.g., the dielectric layer 526). While the removal of the conductive materials from above the top surface of the wide metal lines 558 may be controlled by the duration of the polishing process, the formation of the dishing profile 560 may be controlled by actions of various chemical agents in a CMP slurry configured to tune the removal selectivity of one or more materials. Stated yet another way, the CMP process may be tuned to remove portions of the conductive material in the wide metal lines 558 at a higher rate than its surrounding components. The dishing profile 560 may have a depth from about zero (planarization) to about 10% of a height of the wide metal lines 558 (which substantially equals to the height of the narrow metal lines 524), such as ranging from about 0 Å to about 60 Å in some embodiments.

Figure 18:
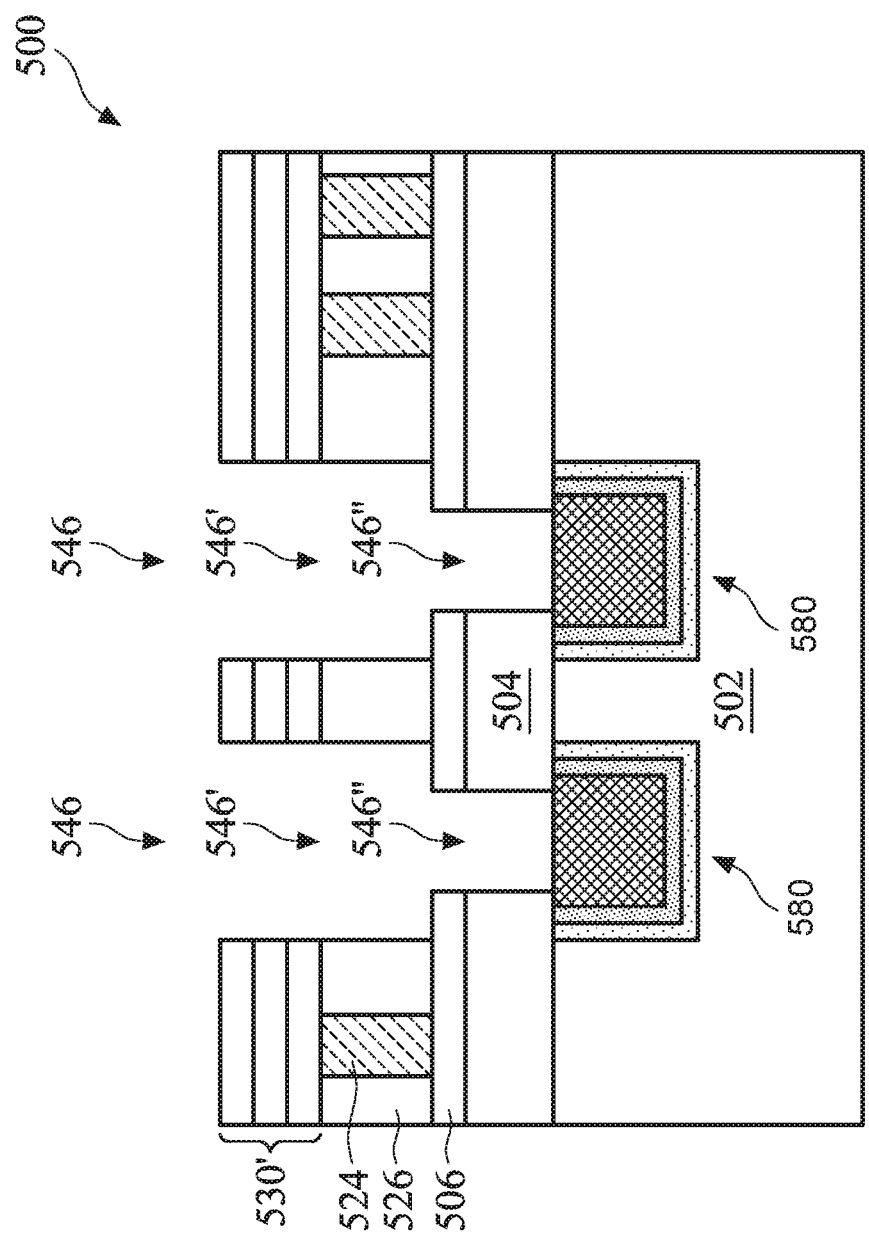
Figure 19:
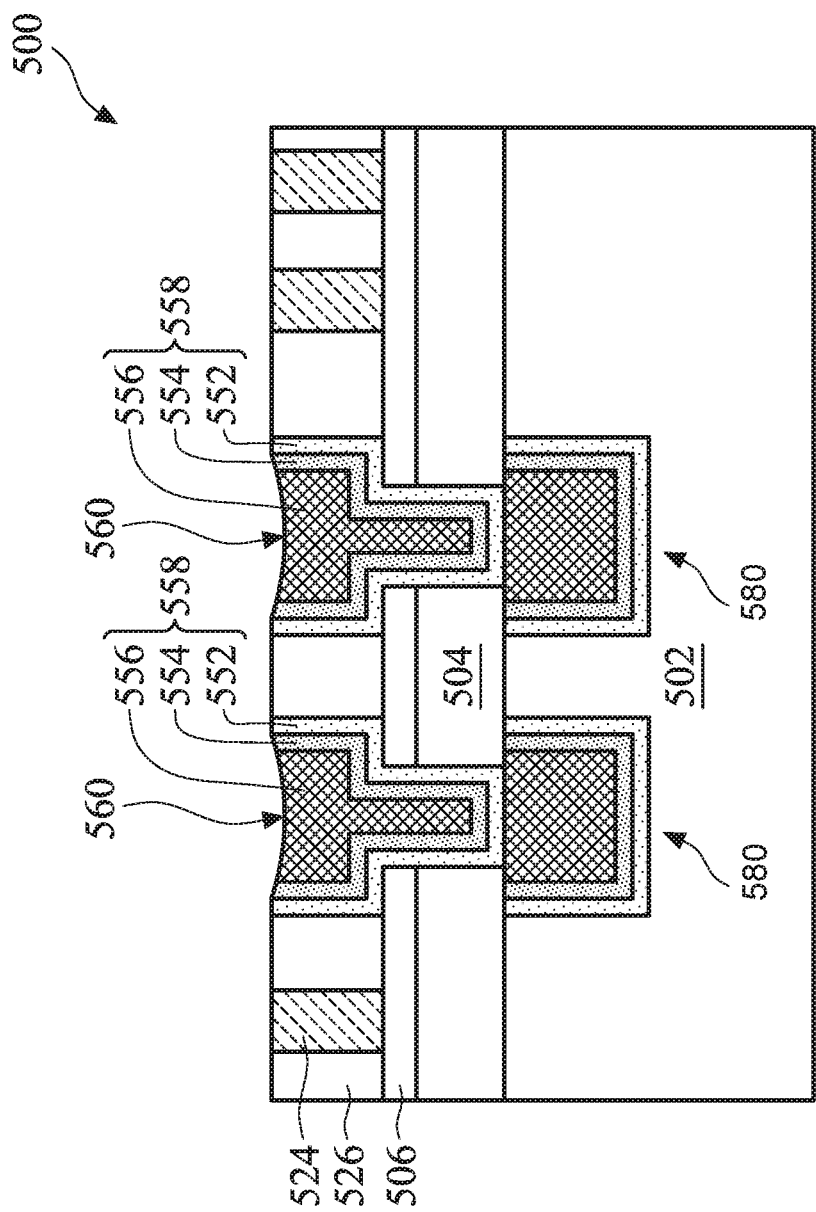

Referring to FIGS. 18 and 19 collectively, in some embodiments, the substrate 502 includes one or more underlying conductive features 580 in its top portion, and operations 412 and 414 may further include processes to open the etch stop layer 506 and to extend openings 546 downwardly into the dielectric layer 504 to form wide metal lines and vias that land on the underlying conductive features 580. The underlying conductive feature 580 is a metal feature, such as a metal line, a metal via, or a metal contact feature. In some embodiments, the underlying conductive feature 580 includes both a metal line and a metal via, formed by a suitable procedure, such as dual damascene process, or other suitable process including atomic layer deposition (ALD), chemical vapor deposition (CVD), physical vapor deposition (PVD), electroless metal deposition (ELD), or electrochemical plating (ECP) process. The material of the underlying conductive feature 580 may include copper (Cu) or copper alloys. Alternatively, it may also be formed of, or comprise, other conductive materials, such as Nickel (Ni), Cobalt (Co), Ruthenium (Ru), Iridium (Ir), Aluminum (Al), Platinum (Pt), Palladium (Pd), Gold (Au), Silver (Ag), Osmium (Os), Tungsten (W), and the like. The steps for forming the underlying conductive feature 580 may include forming a damascene opening in the substrate 502, forming a diffusion barrier layer in the opening, depositing an adhesion layer, and filling the opening, for example, in an electroplating process.

Operation 412 may extend the openings 546 downwardly into the dielectric layer 504 through one or more etching processes, where the openings 546 is at least partially aligned with the underlying conductive features 580. In the illustrated embodiment, the openings 546 include the trench openings 546' and the via openings 546". Operation 412 includes an etching process to remove a portion of the etch stop layer 506 from the bottom of the trench openings 546' and expose the dielectric layer 504. The formation of the via openings 546" may be assisted by photoresist for defining patterns. Photoresist is then removed in a suitable process such as resist stripping or plasma ashing. Operation 414 subsequently fills the openings 546 with conductive materials, thereby forming wide metal lines 558 connecting with the underlying conductive features 580 through via structures therebetween. A CMP process is then performed to remove excess materials. The remaining portion of the wide metal lines 558 may include a dishing profile 560 as shown in FIG. 19, which is similar to what has been discussed above in association with FIG. 17.

Figure 20:
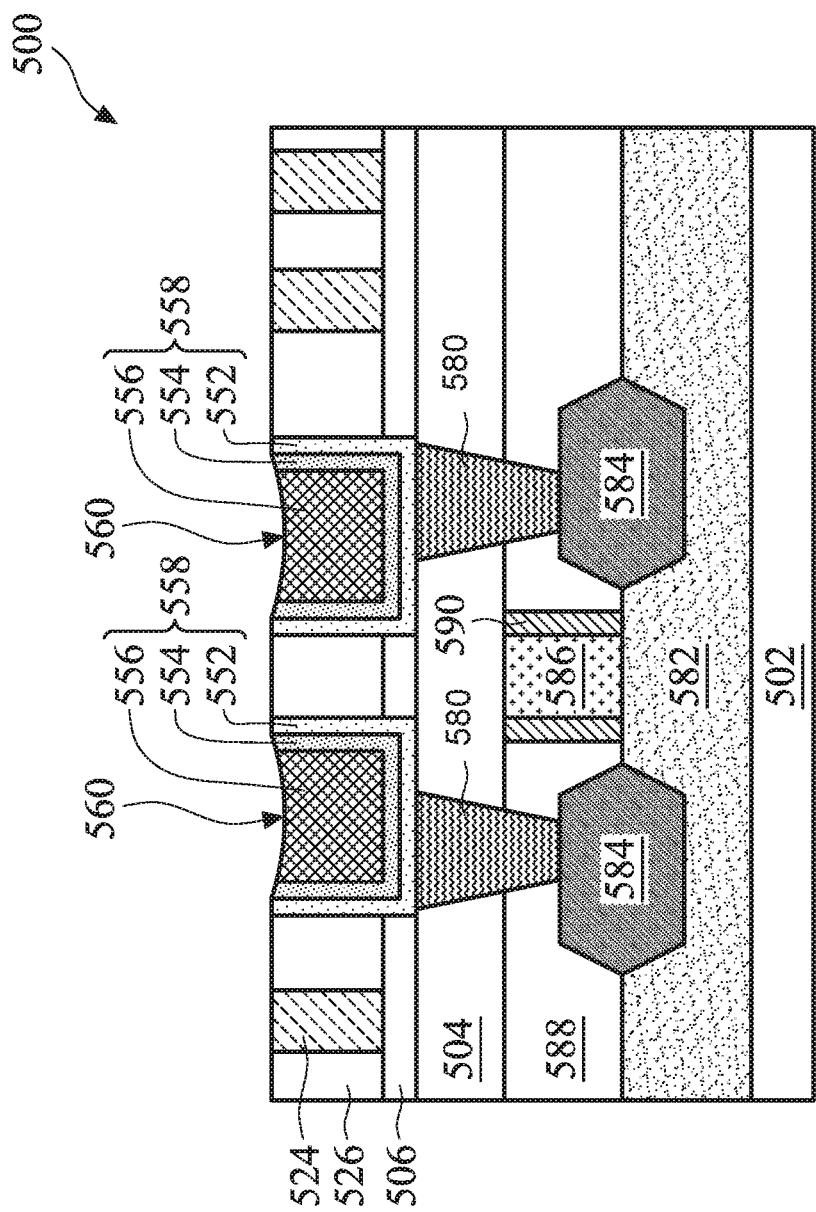

In some embodiments, the underlying conductive feature 580 alternatively can be other conductive features. In some embodiments, the underlying conductive feature 580 is a capacitor, or resistor. In some embodiments, the underlying conductive feature 580 is a gate electrode or a source/drain (S/D) contact. Referring to FIG. 20, in the illustrated embodiment, underlying conductive feature 580 is a S/D contact (referred to as the S/D contact 580 hereinafter). Operation 412 opens the etching stop layer 506 and exposes a top portion of the S/D contact 580. Wide metal lines 558 thereafter land on the S/D contact 580 and provide electrical routing for the respective transistors underneath to connect with other portions of the integrated circuit.

Still referring to FIG. 20, the device 500 includes an active region 582. In some embodiments, the active region 582 includes a plurality of fins extending away from a top surface of the substrate 502. As such, the active region 582 is said to provide at least one FinFET. Alternatively, the active region 582 may provide planar FETs. The active region 582 may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The active region 582 may be doped with an n-type dopant or a p-type dopant for forming p-type FET and n-type FET, respectively. If including fins, the active region 582 may be formed using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The device 500 further includes source/drain (S/D) features 584 disposed in the active region 582, a metal gate stack 586 disposed adjacent the S/D features 584, and S/D contacts 580 disposed over the S/D features 584 and in an interlayer dielectric (ILD) layer 588. In many embodiments, the S/D features 584 may be suitable for a p-type FET device (e.g., a p-type epitaxial material) or alternatively, an n-type FET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. The S/D features 584 may be formed by any suitable techniques, such as etching processes followed by one or more epitaxy processes.

Though not depicted, the metal gate stack 586 may include a plurality of material layers, such as a high-k dielectric layer and a gate electrode disposed over the high-k dielectric layer. The metal gate stack 18 may further include other material layers, such as an interfacial layer, barrier layers, hard mask layers, other suitable layers, or combinations thereof. The high-k dielectric layer may include a dielectric material having a high dielectric constant, for example, greater than that of thermal silicon oxide (~3.9). In one example, the high-k dielectric layer may include a high-K dielectric layer such as hafnium oxide (HfO2). The gate electrode may include at least one work-function metal (WFM) layer and a bulk conductive layer. The gate electrode may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Various layers of the metal gate stack 18 may be formed by any suitable method, such as chemical oxidation, thermal oxidation, atomic layer deposition (ALD), chemical vapor deposition (CVD), physical vapor deposition (PVD), plating, other suitable methods, or combinations thereof. A polishing process (e.g., CMP) may be performed to remove excess materials from a top surface of the metal gate stack to planarize a top surface of the metal gate stack 586.

In various embodiments, the device 500 further includes gate spacers 590 disposed on sidewalls of the metal gate stacks 586. The gate spacers 590 may include a dielectric material, such as silicon oxide, silicon nitride, silicon carbide, silicon oxynitride, other suitable dielectric materials, or combinations thereof. The gate spacers 590 may be formed by first depositing a blanket of spacer material over the device 500, and then performing an anisotropic etching process to remove portions of the spacer material to form the gate spacers 590 on the sidewalls of the metal gate stacks 586.

The S/D contacts 580 disposed in the ILD layer 588 and physically contacting the S/D features 584. The S/D contacts 580 are configured to connect the S/D features 584 with subsequently formed interconnect structures, such as vias and conductive lines. In many embodiments, the S/D contacts 580 includes a conductive material such as Cu, W, Ru, Mo, Al, Co, Ni, Mn, Ag, other suitable conductive materials, or combinations thereof. The S/D contacts 580 may be formed by first patterning the ILD layer 588 to form trenches (not depicted) to expose the S/D features 584, and depositing the conductive material by CVD, PVD, ALD, plating, other suitable methods, or combinations thereof to form the S/D contacts 580. In many embodiments, the ILD layer 588 is substantially similar to the dielectric layer 504 in composition and may be formed by any suitable method as discussed above. In a specific example, the ILD layer 588 includes a porous low-k dielectric material such as carbon-doped silicon oxide having a porosity of about 1% to about 8%.

Although not intended to be limiting, one or more embodiments of the present disclosure provide many benefits to a semiconductor device and the formation thereof. For example, embodiments of the present disclosure provide a hybrid method that combines metal etching process and damascene process, and a resulting novel interconnect structure that includes narrow metal lines formed by a noble metal (or other suitable metal) through a metal etching process and relatively wider metal lines formed by copper (or other suitable metal) through damascene process. The conductivity of interconnection layers is improved even at the minimum metal line width. Furthermore, the hybrid method for forming interconnect structures can be easily integrated into existing semiconductor fabrication processes.

In one exemplary aspect, the present disclosure is directed to a method. The method includes providing a device having a substrate, a first dielectric layer over the substrate, and a first conductive feature over the first dielectric layer, the first conductive feature comprising a first metal, the first metal being a noble metal; depositing a second dielectric layer over the first dielectric layer and covering at least sidewalls of the first conductive feature; etching the second dielectric layer to form a trench; and forming a second conductive feature in the trench, wherein the second conductive feature comprises a second metal different from the first metal. In some embodiments, the second metal is a non-noble metal. In some embodiments, the first metal is selected from: Ru, Ir, Rh, and Pt, and the second metal is selected from Cu, Co, Ni, Ag, and Al. In some embodiments, the forming of the second conductive feature includes depositing the second conductive feature in the trench and over the first conductive feature and planarizing the second conductive feature to remove a top portion of the second conductive feature over the first conductive feature, thereby exposing the first conductive feature. In some embodiments, after the planarizing of the second conductive feature, a top surface of the second conductive feature has a dishing profile. In some embodiments, the first conductive feature has a first width, and the trench has a second width larger than the first width. In some embodiments, a ratio of the second width over the first width is at least 2.5. In some embodiments, the depositing of the second conductive feature includes depositing a liner layer in the trench and forming a bulk metal layer over the liner layer, wherein the bulk metal layer comprises the second metal. In some embodiments, the device includes a third conductive feature between the substrate and the first dielectric layer, and the third conductive feature is in direct contact with a bottom surface of the first dielectric layer. In some embodiments, the method further includes etching the first dielectric layer to extend the trench downwardly to expose the third conductive feature, where a bottom portion of the second conductive feature lands on the third conductive feature.

In another exemplary aspect, the present disclosure is directed to a method. The method includes providing a substrate; forming a metal layer over the substrate, the metal layer comprising a first metal; patterning the metal layer to form metal lines in an etching process; forming a dielectric layer covering at least sidewalls of the metal lines; recessing the dielectric layer to form a trench between two adjacent metal lines, the trench having a width larger than any of the metal lines; and forming a conductive feature in the trench, the conductive feature comprising a second metal different from the first metal. In some embodiments, the first metal is a noble metal and the second metal is a non-noble metal. In some embodiments, the first metal is selected from: Ru, Ir, Rh, Pt, Co, Mo, and W, and the second metal is selected from Cu, Co, Ni, Ag, and Al. In some embodiments, the etching process includes reactive-ion etching. In some embodiments, the forming of the conductive feature includes a damascene process. In some embodiments, prior to the recessing of the dielectric layer, the method further includes planarizing the dielectric layer to expose the metal lines; forming a hard mask layer covering the dielectric layer and the metal lines; and patterning the hard mark layer to form an opening above the dielectric layer, wherein the recessing of the dielectric layer is performed through the opening. In some embodiments, the forming of the conductive feature includes depositing the conductive feature over the hard mask layer and the metal lines. In some embodiments, the forming of the metal layer includes a physical vapor deposition (PVD) process or a chemical vapor deposition (CVD) process.

In yet another exemplary aspect, the present disclosure is directed to a semiconductor structure. The semiconductor structure includes a substrate and an interconnect layer over the substrate. The interconnect layer includes a dielectric layer, a first conductive feature disposed in the dielectric layer, wherein the first conductive feature has a first width, and wherein the first conductive feature comprises a first metal, and a second conductive feature disposed in the dielectric layer. The second conductive feature has a second width larger than the first width. The second conductive feature includes a second metal different from the first metal and wherein the first and second conductive feature have substantially the same height. In some embodiments, the first metal is a noble metal and the second metal is a non-noble metal. In some embodiments, the first metal is selected from: Ru, Ir, Rh, and Pt, and the second metal is selected from Cu, Co, Ni, Ag, and Al.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a device having a substrate, a first dielectric layer over the substrate, and a first conductive feature over the first dielectric layer, the first conductive feature comprising a first metal, the first metal being a noble metal;
depositing a second dielectric layer over the first dielectric layer and covering at least sidewalls of the first conductive feature;
etching the second dielectric layer to form a trench, thereby exposing a top surface of the first dielectric layer in the trench; and
forming a second conductive feature in the trench, wherein the second conductive feature comprises a second metal different from the first metal.

2. The method of claim 1, wherein the second metal is a non-noble metal.

3. The method of claim 2, wherein the first metal is selected from: Ru, Ir, Rh, and Pt, and the second metal is selected from Cu, Co, Ni, Ag, and Al.

4. The method of claim 1, wherein the forming of the second conductive feature includes:
depositing the second conductive feature in the trench and over the first conductive feature; and
planarizing the second conductive feature to remove a top portion of the second conductive feature over the first conductive feature, thereby exposing the first conductive feature.

5. The method of claim 4, wherein after the planarizing of the second conductive feature, a top surface of the second conductive feature has a dishing profile.

6. The method of claim 1, wherein the first conductive feature has a first width, and the trench has a second width larger than the first width.

7. The method of claim 6, wherein a ratio of the second width over the first width is at least 2.5.

8. The method of claim 1, wherein the depositing of the second conductive feature includes:
depositing a liner layer in the trench; and
forming a bulk metal layer over the liner layer, wherein the bulk metal layer comprises the second metal.

9. The method of claim 1, wherein the device includes a third conductive feature between the substrate and the first dielectric layer, and wherein the third conductive feature is in direct contact with a bottom surface of the first dielectric layer, further comprising:
etching the first dielectric layer to extend the trench downwardly to expose the third conductive feature, wherein a bottom portion of the second conductive feature lands on the third conductive feature.

10. A method, comprising:
providing a substrate;
forming a metal layer over the substrate, the metal layer comprising a first metal;
patterning the metal layer to form metal lines in an etching process;
forming a dielectric layer covering at least sidewalls of the metal lines;
recessing the dielectric layer to form a trench between two adjacent metal lines, the trench having a width larger than any of the metal lines;
forming a conductive feature in the trench, the conductive feature comprising a second metal different from the first metal; and
performing a planarization process, thereby exposing top surfaces of the metal lines.

11. The method of claim 10, wherein the first metal is a noble metal and the second metal is a non-noble metal.

12. The method of claim 10, wherein the first metal is selected from: Ru, Ir, Rh, Pt, Co, Mo, and W, and the second metal is selected from Cu, Co, Ni, Ag, and Al.

13. The method of claim 10, wherein the etching process includes reactive-ion etching.

14. The method of claim 10, wherein the forming of the conductive feature includes a damascene process.

15. The method of claim 10, prior to the recessing of the dielectric layer, further comprising:
planarizing the dielectric layer to expose the metal lines;
forming a hard mask layer covering the dielectric layer and the metal lines; and
patterning the hard mark layer to form an opening above the dielectric layer, wherein the recessing of the dielectric layer is performed through the opening.

16. The method of claim 15, wherein the forming of the conductive feature includes depositing the conductive feature over the hard mask layer and the metal lines.

17. The method of claim 10, wherein the forming of the metal layer includes a physical vapor deposition (PVD) process or a chemical vapor deposition (CVD) process.

18. A method, comprising:
providing a substrate;
forming a conductive layer over the substrate;
patterning the conductive layer in forming a first conductive feature;
depositing a dielectric layer, the dielectric layer being in physical contact with both the first conductive feature and the substrate;
patterning the dielectric layer in forming a trench; and
forming a second conductive feature in the trench, the first and second conductive features having different material compositions, wherein a portion of the dielectric layer is stacked between the first conductive feature and the second conductive feature.

19. The method of claim 18, where the second conductive feature has a width larger than the first conductive feature.

20. The method of claim 18, wherein the first conductive feature comprises a noble metal and the second conductive feature is free of the noble metal.

* * * * *